(12) United States Patent
Baek et al.

(10) Patent No.: US 11,587,940 B2
(45) Date of Patent: Feb. 21, 2023

(54) THREE-DIMENSIONAL SEMICONDUCTOR MEMORY DEVICES

(71) Applicant: Samsung Electronics Co., Ltd., Suwon-si (KR)

(72) Inventors: Seokcheon Baek, Hwaseong-si (KR); Geunwon Lim, Yongin-si (KR); Jaehoon Shin, Suwon-si (KR); Myungkeun Lee, Seoul (KR)

(73) Assignee: Samsung Electronics Co., Ltd.

( * ) Notice: Subject to any disclaimer, the term of this patent is extended or adjusted under 35 U.S.C. 154(b) by 715 days.

(21) Appl. No.: 16/412,875

(22) Filed: May 15, 2019

(65) Prior Publication Data
US 2020/0111803 A1 Apr. 9, 2020

(30) Foreign Application Priority Data
Oct. 8, 2018 (KR) .................. 10-2018-0120033

(51) Int. Cl.
*H01L 27/11556* (2017.01)
*H01L 29/792* (2006.01)
*H01L 27/11582* (2017.01)

(52) U.S. Cl.
CPC .. *H01L 27/11556* (2013.01); *H01L 27/11582* (2013.01); *H01L 29/7926* (2013.01)

(58) Field of Classification Search
CPC ......... H01L 27/11565; H01L 27/11524; H01L 23/528; H01L 27/11582; H01L 29/7926
See application file for complete search history.

(56) References Cited

U.S. PATENT DOCUMENTS

| | | | |
|---|---|---|---|
| 9,224,750 B1 * | 12/2015 | Yeh | H01L 29/511 |
| 9,306,041 B2 | 4/2016 | Hwang | |
| 9,425,205 B2 | 8/2016 | Shimura | |
| 9,530,789 B2 | 12/2016 | Lee | |
| 9,825,048 B2 | 11/2017 | Cernea | |
| 9,865,540 B2 | 1/2018 | Kim | |
| 2014/0299931 A1 * | 10/2014 | Choi | H01L 21/32134 438/589 |
| 2017/0207232 A1 | 7/2017 | You | |
| 2017/0207238 A1 * | 7/2017 | Lee | H01L 27/11575 |
| 2018/0026047 A1 | 1/2018 | Park | |
| 2018/0102314 A1 * | 4/2018 | Kim | H01L 23/528 |
| 2018/0366489 A1 * | 12/2018 | Harari | H01L 21/76802 |
| 2020/0035702 A1 * | 1/2020 | Lee | H01L 27/11519 |

FOREIGN PATENT DOCUMENTS

KR 20170046892 5/2017

* cited by examiner

*Primary Examiner* — Eric K Ashbahian
(74) *Attorney, Agent, or Firm* — Myers Bigel, P.A.

(57) ABSTRACT

Disclosed is a three-dimensional semiconductor memory device comprising a peripheral circuit structure on a first substrate, a second substrate on the peripheral circuit structure, first to fourth stack structures spaced apart in a first direction on the second substrate, first and second support connectors between the second and third stack structures, third and fourth support connectors between the third and fourth stack structures, and a through dielectric pattern penetrating the first stack structure and the second substrate. A first distance between the first and second support connectors is different from a second distance between the third and fourth support connectors.

16 Claims, 23 Drawing Sheets

US 11,587,940 B2

THREE-DIMENSIONAL SEMICONDUCTOR MEMORY DEVICES

CROSS-REFERENCE TO RELATED APPLICATION

This U.S. nonprovisional application claims priority under 35 U.S.C § 119 to Korean Patent Application No. 10-2018-0120033, filed on Oct. 8, 2018, in the Korean Intellectual Property Office, the entire contents of which are incorporated by reference herein.

BACKGROUND

The present inventive concepts relate to three-dimensional semiconductor memory devices, and more particularly, to three-dimensional semiconductor memory devices with enhanced reliability.

Semiconductor devices have been highly integrated to meet the high performance and low manufacturing cost demands of customers. Because integration of the semiconductor devices is an important factor in determining product price, high integration is increasingly requested. Integration of typical two-dimensional and/or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional and/or planar semiconductor devices. Therefore, three-dimensional semiconductor memory devices having three-dimensionally arranged memory cells have been proposed.

SUMMARY

Some example embodiments of the present inventive concepts provide semiconductor devices with enhanced reliability.

An object of the present inventive concepts is not limited to those mentioned above, and other objects which have not been mentioned above will be clearly understood by those skilled in the art from the following description.

According to some example embodiments of the present inventive concepts, a three-dimensional semiconductor memory device may comprise: a peripheral circuit structure on a first substrate; a second substrate on the peripheral circuit structure; a first stack structure, a second stack structure, a third stack structure, and a fourth stack structure that are spaced apart in a first direction on the second substrate; a first support connector and a second support connector that are between the second stack structure and the third stack structure; a third support connector and a fourth support connector that are between the third stack structure and the fourth stack structure; and a through dielectric pattern that penetrates the first stack structure and the second substrate. A first distance between the first support connector and the second support connector may be different from a second distance between the third support connector and the fourth support connector.

According to some example embodiments of the present inventive concepts, a three-dimensional semiconductor memory device may comprise: a peripheral circuit structure on a first substrate; a second substrate on the peripheral circuit structure; a first stack structure, a second stack structure, a third stack structure, and a fourth stack structure that are spaced apart in a first direction on the second substrate; a plurality of first supporters between the second stack structure and the third stack structure; a plurality of second supporters between the third stack structure and the fourth stack structure; and a through dielectric pattern that penetrates the first stack structure and the second stack structure. A first number of the plurality of first supporters may be greater than a second number of the plurality of second supporters.

According to some example embodiments of the present inventive concepts, a three-dimensional semiconductor memory device may comprise: a peripheral circuit structure on a first substrate; a second substrate on the peripheral circuit structure; a first stack structure, a second stack structure, a third stack structure, and a fourth stack structure that are spaced apart in a first direction on the second substrate; a plurality of first supporters between the second stack structure and the third stack structure; a plurality of second supporters between the third stack structure and the fourth stack structure; and a through dielectric pattern that penetrates the first stack structure and the second substrate. A sum of first planar areas of the plurality of first supporters may be greater than a sum of second planar areas of the plurality of second supporters.

DETAILED DESCRIPTION

Figure 1:
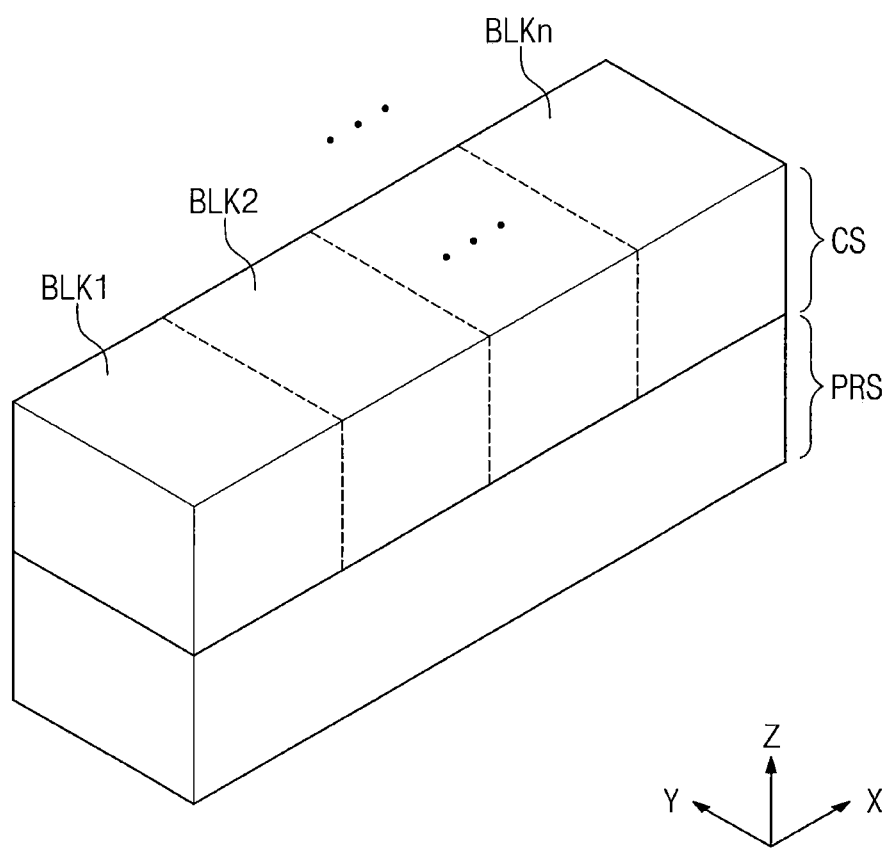
FIG. 1 illustrates a simplified perspective view showing a three-dimensional semiconductor memory device according to some example embodiments of the present inventive concepts.

FIG. 1 illustrates a simplified perspective view showing a three-dimensional semiconductor memory device according to some example embodiments of the present inventive concepts.

Referring to FIG. 1, a three-dimensional semiconductor memory device according to some embodiments may include a peripheral circuit structure PRS and a cell array structure CS stacked on the peripheral circuit structure PRS. For example, when viewed in plan, the peripheral circuit structure PRS and the cell array structure CS may overlap each other (e.g., in a vertical direction).

The peripheral circuit structure PRS may include a page buffer, control circuits, and/or row and column decoders that control or otherwise interact with the cell array structure CS of the three-dimensional semiconductor memory device.

The cell array structure CS may include a plurality of memory blocks BLK1 to BLKn each of which may include a data erasure unit. Each of the memory blocks BLK1 to BLKn may include a memory cell array having a three-dimensional or vertical structure. The memory cell array may include three-dimensionally arranged memory cells and a plurality of word lines and bit lines electrically connected to the memory cells. Each of the memory blocks BLK1 to BLKn may include first, second, third, and fourth stack structures ST1, ST2, ST3, and ST4 (see, e.g., FIG. 3). The memory cell array having the three-dimensional structure will be further discussed below in detail with reference to the accompanying drawings.

Figure 2:
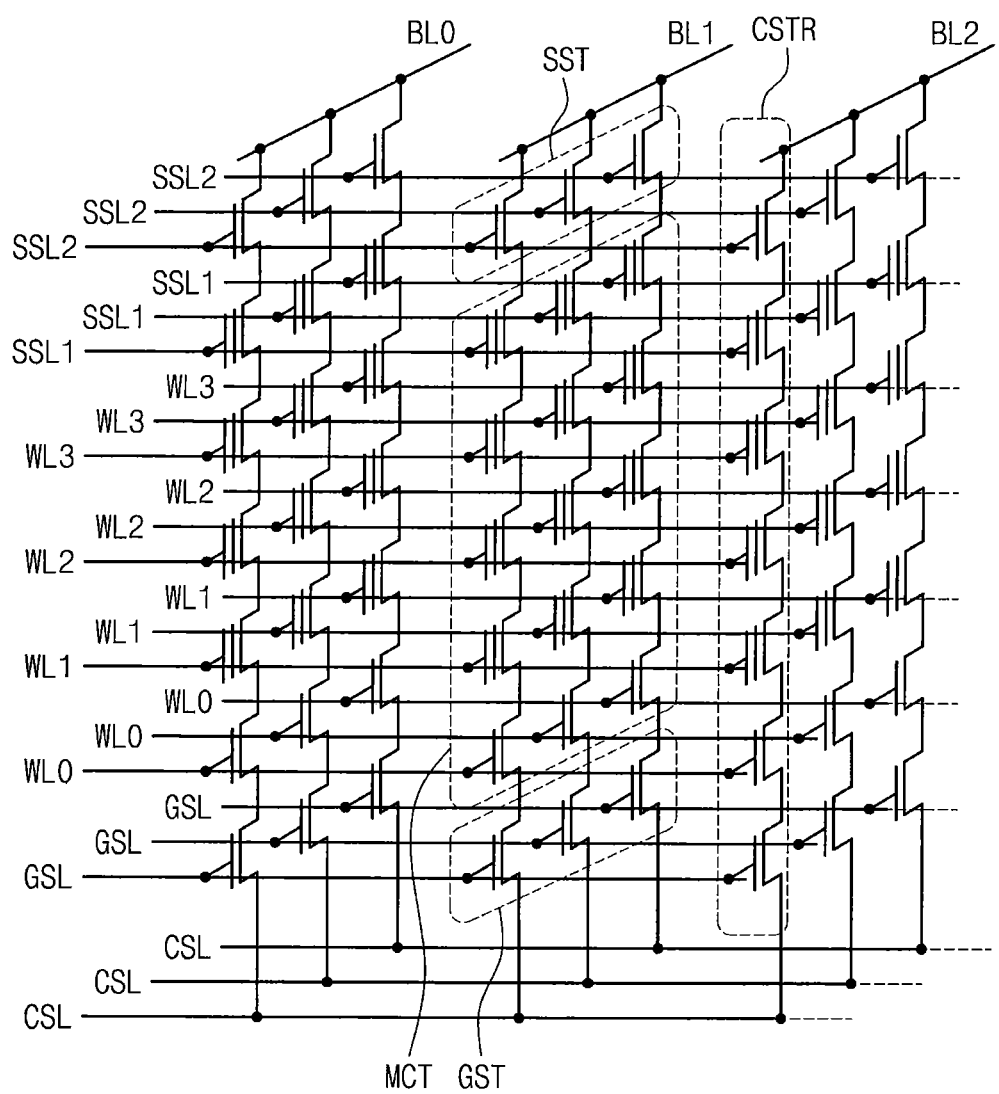
FIG. 2 illustrates a simplified circuit diagram showing a cell array of a three-dimensional semiconductor memory device according to some example embodiments of the present inventive concepts.

FIG. 2 illustrates a simplified circuit diagram showing a cell array of a three-dimensional semiconductor memory device according to some example embodiments of the present inventive concepts.

Referring to FIG. 2, a three-dimensional semiconductor memory device may include a common source line CSL, a plurality of bit lines BL0 to BL2, and a plurality of cell strings CSTR between the common source line CSL and the bit lines BL0 to BL2.

The common source line CSL may be a conductive thin layer disposed on a semiconductor substrate or an impurity region formed in the semiconductor substrate. The bit lines BL0 to BL2 may be conductive patterns (e.g., metal lines) disposed above and spaced apart from the semiconductor substrate. The bit lines BL0 to BL2 may be arranged adjacent one another, and a plurality of cell strings CSTR may be connected in parallel to each of the bit lines BL0 to BL2. In some embodiments, the cell strings CSTR may be arranged either on the common source line CSL or on the semiconductor substrate.

Each of the cell strings CSTR may include a ground select transistor GST connected to the common source line CSL, a string select transistor SST connected to one of the bit lines BL0 to BL2, and a plurality of memory cell transistors MCT disposed between the ground and string select transistors GST and SST. The ground select transistor GST, the string select transistor SST, and the memory cell transistors MCT may be connected in series. In addition, a ground select line GSL, a plurality of word lines WL0 to WL3, and a plurality of string select lines SSL1 and SSL2 disposed between the common source line CSL and the bit lines BL0 to BL2 may be respectively connected to gate electrodes of the ground select transistor GST, the memory cell transistors MCT, and the string select transistor SST.

The ground select transistors GST may be disposed at substantially the same distance from the semiconductor substrate, and their gate electrodes may be commonly connected to the ground select line GSL to have the same electrical potential state. The ground select line GSL may be disposed between the common source line CSL and its most adjacent memory cell transistor MCT. Similarly, the gate electrodes of the plurality of memory cell transistors MCT, which are located at substantially the same distance from the common source line CSL, may also be commonly connected to the one of the word lines WL0 to WL3 to have the same electrical potential state. Because one cell string CSTR includes a plurality of memory cell transistors MCT disposed at different distances from the common source line CSL, the word lines WL0 to WL3 may be disposed to have a multi-layered structure between the common source line CSL and the bit lines BL0 to BL2.

The ground and string select transistors GST and SST and the memory cell transistors MCT may be metal-oxide-semiconductor (MOS) field effect transistors (MOSFET) using channel structures as channel regions.

Figure 3:
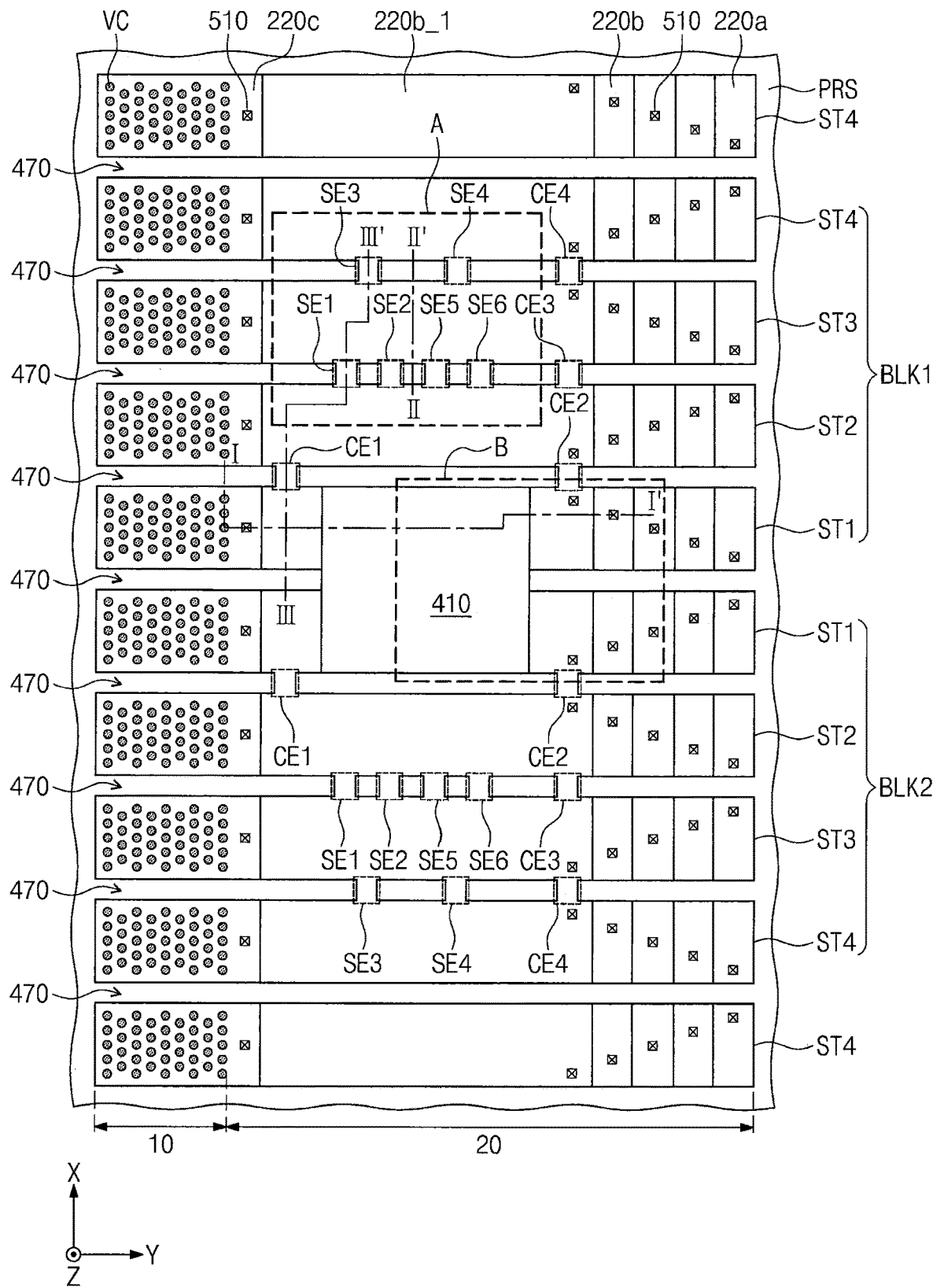
FIG. 3 illustrates a plan view showing a three-dimensional semiconductor memory device according to some example embodiments of the present inventive concepts.
Figure 4:
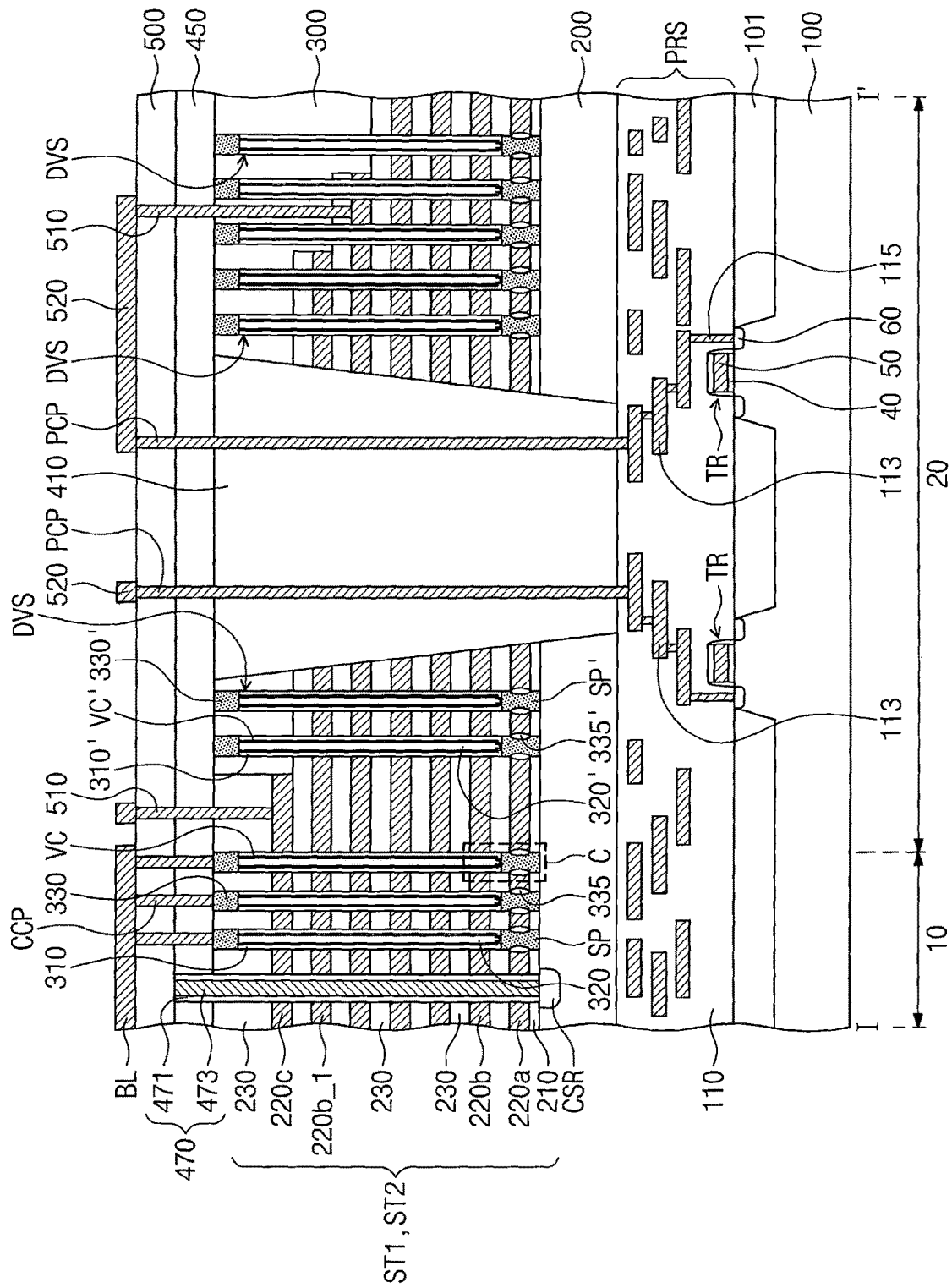
FIG. 4 illustrates a cross-sectional view taken along line I-I' of FIG. 3, showing a three-dimensional semiconductor memory device according to some example embodiments of the present inventive concepts.
Figure 5:
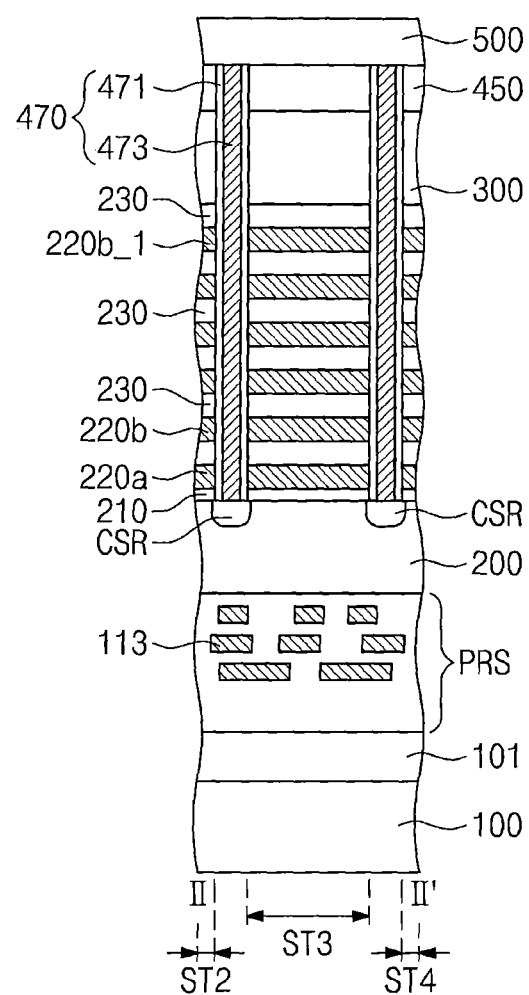
FIG. 5 illustrates a cross-sectional view taken along line II-II' of FIG. 3, showing a three-dimensional semiconductor memory device according to some example embodiments of the present inventive concepts.
Figure 6:
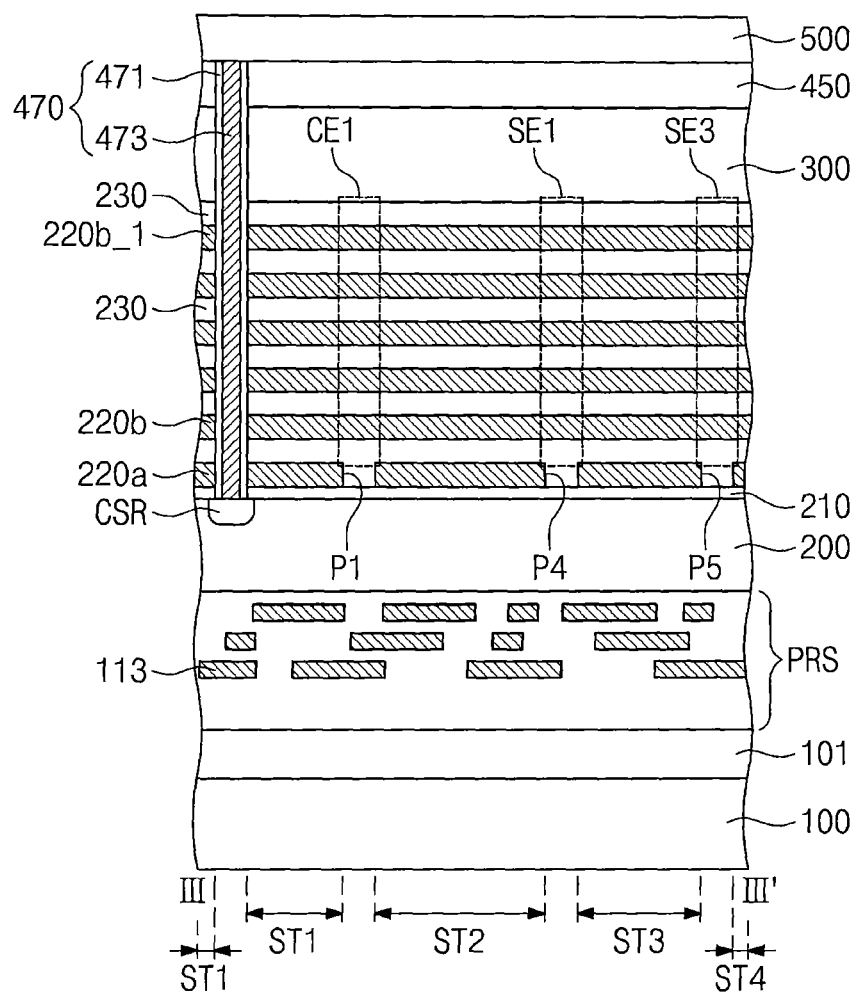
FIG. 6 illustrates a cross-sectional view taken along line III-III' of FIG. 3, showing a three-dimensional semiconductor memory device according to some example embodiments of the present inventive concepts.
Figure 7:
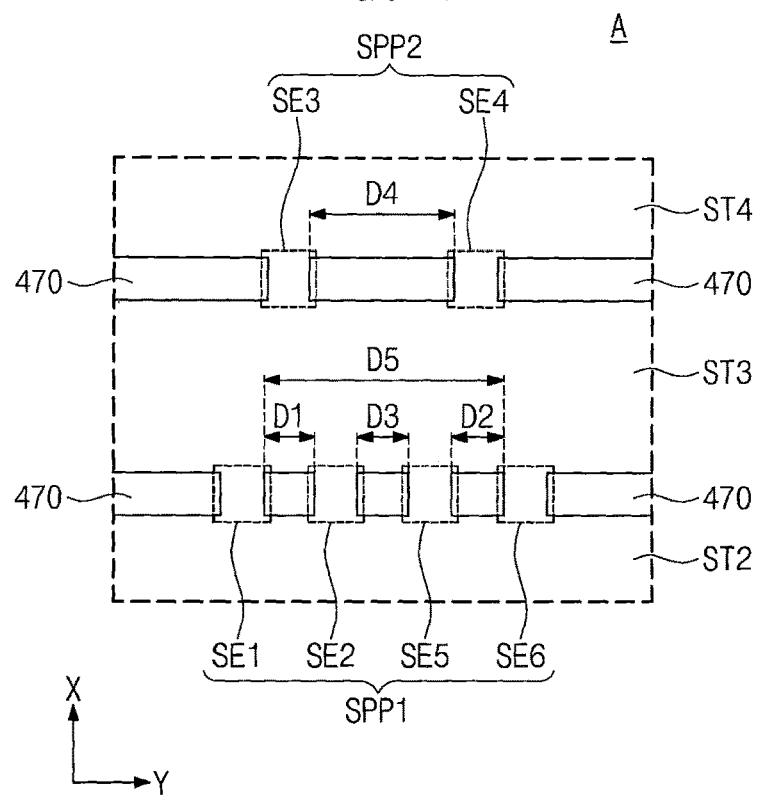
FIG. 7 illustrates an enlarged view of section A of FIG. 3.
Figure 8:
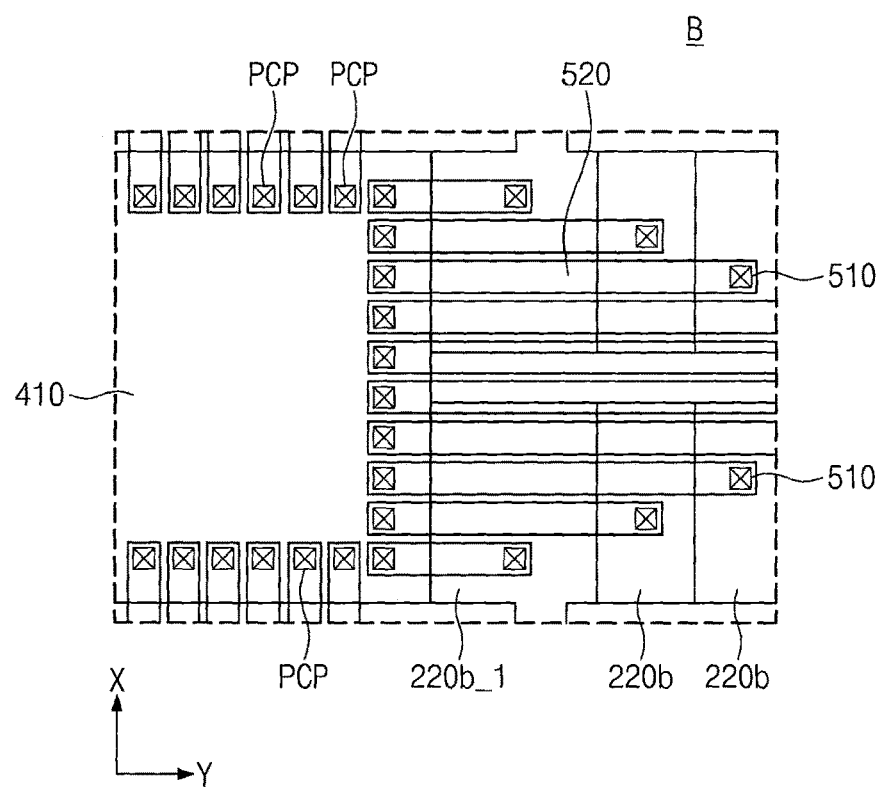
FIG. 8 illustrates an enlarged view of section B of FIG. 3.
Figure 9:
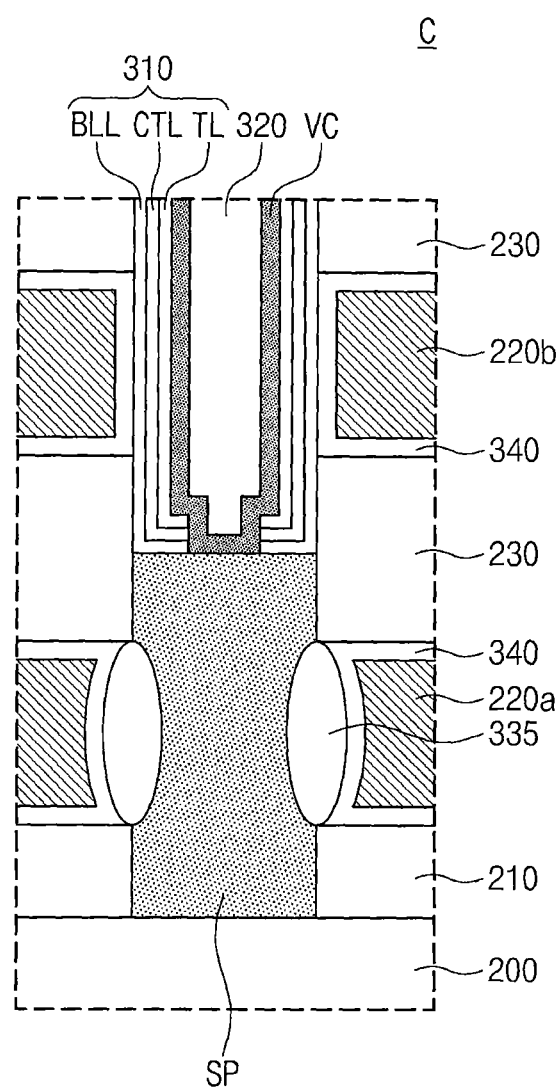
FIG. 9 illustrates an enlarged view of section C of FIG. 4.

FIG. 3 illustrates a plan view showing a three-dimensional semiconductor memory device according to some example embodiments of the present inventive concepts. FIG. 4 illustrates a cross-sectional view taken along line I-I' of FIG. 3, showing a three-dimensional semiconductor memory device according to some example embodiments of the present inventive concepts. FIG. 5 illustrates a cross-sectional view taken along line II-II' of FIG. 3, showing a three-dimensional semiconductor memory device according to some example embodiments of the present inventive concepts. FIG. 6 illustrates a cross-sectional view taken along line III-III' of FIG. 3, showing a three-dimensional semiconductor memory device according to some example embodiments of the present inventive concepts. FIG. 7 illustrates an enlarged view of section A of FIG. 3. FIG. 8 illustrates an enlarged view of section B of FIG. 3. FIG. 9 illustrates an enlarged view of section C of FIG. 4.

Referring to FIGS. 3 to 9, a three-dimensional semiconductor memory device may include a peripheral circuit structure PRS on a first substrate 100, a second substrate 200 on the peripheral circuit structure PRS, and first and second memory blocks BLK1 and BLK2 on the second substrate 200.

The first substrate 100 may be a silicon substrate, a silicon-germanium substrate, a germanium substrate, or a single crystalline epitaxial layer grown on a single crystalline silicon substrate. A device isolation layer 101 may be disposed in the first substrate 100. The device isolation layer 101 may define active regions of the first substrate 100. The device isolation layer 101 may include, for example, a dielectric material, such as a silicon oxide layer.

The peripheral circuit structure PRS may be disposed on the first substrate 100. The peripheral circuit structure PRS may include transistors TR, a first interlayer dielectric layer 110, connection lines 113, and vias 115. The transistors TR may be disposed on the active regions of the first substrate 100. The transistors TR may include a peripheral gate dielectric layer 40, a peripheral gate electrode 50, and source/drain regions 60. The peripheral gate dielectric layer 40 may be disposed on the active regions of the first substrate 100. The peripheral gate dielectric layer 40 may include, for example, a silicon oxide layer and/or a thermal oxide layer. The peripheral gate electrode 50 may be disposed on the peripheral gate dielectric layer 40. The peripheral gate electrode 50 may include, for example, metal and/or impurity-doped polysilicon. The source/drain regions 60 may be disposed in the active regions of the first substrate 100 on opposite sides of the peripheral gate electrode 50. The source/drain regions 60 may have a conductive type different from that of the first substrate 100.

The first interlayer dielectric layer 110 may be disposed on the first substrate 100. The first interlayer dielectric layer 110 may be on and, in some embodiments, cover the transistors TR. The first interlayer dielectric layer 110 may include a plurality of layers. The first interlayer dielectric layer 110 may include, for example, a silicon oxide layer. The connection lines 113 and the vias 115 may be disposed in the first interlayer dielectric layer 110. Connection lines 113 that are at different levels may be connected to each other through the vias 115 interposed therebetween. The transistors TR may also be connected through the vias 115 to the connection lines 113. In some embodiments, the connection lines 113 and the vias 115 may include metal, such as copper.

The second substrate 200 may be disposed on the peripheral circuit structure PRS. The second substrate 200 may include a cell array region 10 and a pad region 20. The second substrate 200 may include a semiconductor material, such as, for example, silicon (Si), germanium (Ge), silicon germanium (SiGe), gallium arsenic (GaAs), indium gallium arsenic (InGaAs), aluminum gallium arsenic (AlGaAs), or a mixture thereof. The second substrate 200 may include a semiconductor doped with first conductivity impurities or an intrinsic semiconductor with no doped impurities. The second substrate 200 may have at least one selected from a single crystalline structure, an amorphous structure, and a polycrystalline structure.

The first memory block BLK1 and the second memory block BLK2 may be disposed on the cell array region 10 and the pad region 20 of the second substrate 200. The first memory block BLK1 and the second memory block BLK2 may be spaced apart from each other in a first direction (e.g., an X direction). The first memory block BLK1 and the second memory block BLK2 may be arranged alternately in the first direction X. Each of the first and second memory blocks BLK1 and BLK2 may include a first stack structure ST1, a second stack structure ST2, a third stack structure ST3, and a fourth stack structure ST4 that are spaced apart in the foregoing sequence along the first direction X on a top surface of the second substrate 200. The first to fourth stack structures ST1 to ST4 may extend in a second direction (e.g., a Y direction) intersecting the first direction X. The first stack structure ST1 of the first memory block BLK1 may be adjacent in the first direction X to the first stack structure ST1 of the second memory block BLK2. In other words, in some embodiments, the first to fourth stack structures ST1 to ST4 of the first memory block BLK1 may be arranged to extend in the first direction X (e.g., a positive X direction) opposite an arrangement of the first to fourth stack structures ST1 to ST4 of the second memory block BLK2 (e.g., a negative X direction). Common source regions CSR may be disposed in the second substrate 200 between the first to fourth stack structures ST1 to ST4 adjacent to each other in the first direction X. The common source regions CSR may extend in the second direction Y intersecting the first direction X. The common source regions CSR may have a conductive type different from that of the second substrate 200.

Each of the first to fourth stack structures ST1 to ST4 may include on the second substrate 200 a buffer dielectric layer 210, gate electrodes 220a, 220b, 220b_1, and 220c, and dielectric patterns 230, which gate electrodes and dielectric patterns are alternately and repeatedly stacked on the buffer dielectric layer 210. The buffer dielectric layer 210 may include, for example, a thermal oxide layer and/or a silicon oxide layer. The gate electrodes 220a, 220b, 220b_1, and 220c may include a ground select gate electrode 220a, cell gate electrodes 220b and 220b_1, and a string select gate electrode 220c. The ground select gate electrode 220a may correspond to a lowermost (e.g., closest to the second substrate 200) one of the gate electrodes 220a, 220b, 220b1, and 220c, and the string select gate electrode 220c may be an uppermost (e.g., farthest from the second substrate 200) one of the gate electrodes 220a, 220b, 220b_1, and 220c. The cell gate electrodes 220b and 220b_1 may be disposed between the ground select gate electrode 220a and the string select gate electrode 220c.

The first to fourth stack structures ST1 to ST4 may have stepwise structures on the pad region 20 of the second substrate 200. The first to fourth stack structures ST1 to ST4 may have heights (e.g., a vertical dimension) that decrease as a distance from the cell array region 10 increases. The gate electrodes 220a, 220b, 220b_1, and 220c may have lengths (e.g., a horizontal dimension) in the second direction Y that decrease as a distance from the second substrate 200 increases. Each of the gate electrodes 220a, 220b, 220b_1, and 220c may have an end on the pad region 20 of the second substrate 200. The end of each of the ground and cell gate electrodes 220a, 220b, and 220b_1 may correspond to an exposed portion that is not covered with a next overlying (e.g., adjacent) gate electrode. The end of the string select gate electrode 220c may be a portion of the string select gate electrode 220c that is disposed on the pad region 20.

In consideration of a through dielectric pattern 410 disposed on the pad region 20 of the second substrate 200, the end of an uppermost cell gate electrode 220b_1 may have a planar area greater than that of the end of the ground select gate electrode 220a and those of the ends of the cell gate electrodes 220b. The end of the uppermost cell gate electrode 220b_1 may be exposed by (e.g., extend horizontally from beneath an edge of) the string select gate electrode 220c.

The dielectric patterns 230 may be disposed between the gate electrodes 220a, 220b, 220b_1, and 220c adjacent to each other in a third direction (e.g., a Z direction) perpendicular to the top surface of the second substrate 200, and also disposed on the string select gate electrode 220c. The dielectric patterns 230 may include, for example, a silicon oxide layer. The dielectric patterns 230 may have their lengths in the second direction Y that decrease as a distance from the second substrate 200 increases. The length in the second direction Y of each of the dielectric patterns 230 may be substantially the same as the length in the second direction Y of a next underlying (e.g., adjacent) gate electrode. The dielectric patterns 230 may be on and, in some embodiments, cover the ends of the gate electrodes 220a, 220b, 220b1, and 220c.

Interlayer dielectric patterns 300 may cover the stepwise structures of the first to fourth stack structures ST1 to ST4, which stepwise structures are disposed on the pad region 20 of the second substrate 200. The interlayer dielectric patterns 300 may have top surfaces at the same level as that of a top surface of an uppermost dielectric pattern 230.

As shown in FIG. 9, vertical channels VC may be provided in the first to fourth stack structures ST1 to ST4 on the cell array region 10 of the second substrate 200. Respective ones of the vertical channels VC may be disposed on the top surface of the second substrate 200 and may penetrate one of the first to fourth stack structures ST1 to ST4. The vertical channels VC may be arranged in a zigzag or linear fashion along the second direction Y. In some embodiments, each of the vertical channels VC may have a hollow pipe shape, a cylindrical shape, or a cup shape. Each of the vertical channels VC may include a single layer or multiple layers. The vertical channels VC may include, for example, one or more of a single crystalline silicon layer, an organic semiconductor layer, and/or carbon nano-structures.

Semiconductor pillars SP may be disposed between the vertical channels VC and the second substrate 200. The semiconductor pillars SP may be disposed on the top surface of the second substrate 200 and may penetrate the ground select gate electrode 220a. The semiconductor pillars SP may contact the vertical channels VC. The semiconductor pillars SP may be an intrinsic semiconductor or a semiconductor whose conductive type is the same as that of the second substrate 200. As illustrated in FIG. 9, charge storage structures 310 may be disposed between the vertical channels VC and the gate electrodes 220a, 220b, 220b_1, and 220c. The charge storage structures 310 may extend in the third direction Z along outer walls of the vertical channels VC. For example, the charge storage structures 310 may have shapes surrounding the outer walls of the vertical channels VC. The charge storage structures 310 may include a single or multiple layers consisting of, for example, one or more of a silicon oxide layer, a silicon nitride layer, a silicon oxynitride layer, and/or a high-k dielectric layer.

As depicted in FIG. 9, each of the charge storage structures 310 may include a tunnel dielectric layer TL, a blocking dielectric layer BLL, and a charge storage layer CTL. The tunnel dielectric layer TL may be adjacent to the vertical channel VC and may surround the outer wall of the vertical channel VC. The blocking dielectric layer BLL may be adjacent to the gate electrodes 220a, 220b, 220b_1, and 220c. The charge storage layer CTL may be disposed between the tunnel dielectric layer TL and the blocking dielectric layer BLL. The tunnel dielectric layer TL may include, for example, a silicon oxide layer and/or a high-k dielectric layer (e.g., aluminum oxide ($Al_2O_3$) and/or hafnium oxide ($HfO_2$)). The blocking dielectric layer BLL may include, for example, a silicon oxide layer and/or a high-k dielectric layer (e.g., aluminum oxide ($Al_2O_3$) and/or hafnium oxide ($HfO_2$)). The charge storage layer CTL may include, for example, a silicon nitride layer.

As illustrated in FIG. 9, gap-fill layers 320 may be disposed in inner spaces surrounded by the vertical channels VC. The gap-fill layers 320 may include, for example, a silicon oxide layer, a silicon nitride layer, and/or a silicon oxynitride layer. Pads 330 may be disposed on upper portions of the vertical channels VC, of the charge storage structures 310, and of the gap-fill layers 320. The pads 330 may include a conductive material and/or a semiconductor material doped with impurities whose conductive type is different from that of the vertical channels VC.

A gate dielectric layer 335 may be disposed between the semiconductor pillar SP and the ground select gate electrode 220a. The gate dielectric layer 335 may have lateral surfaces that are convexly curved toward opposite directions. The gate dielectric layer 335 may include, for example, a thermal oxide layer. Referring to FIG. 9, horizontal dielectric layers 340 may be disposed between the charge storage structures 310 and the gate electrodes 220b, 220b_1, and 220c, and may extend onto top and bottom surfaces of the gate electrodes 220a, 220b, 220b_1, and 220c, respectively. The horizontal dielectric layers 340 may include, for example, a silicon oxide layer (e.g., $SiO_2$) and/or a high-k dielectric layer (e.g., aluminum oxide ($Al_2O_3$) and/or hafnium oxide ($HfO_2$)).

Dummy vertical channel structures DVS may be disposed on the pad region 20 of the second substrate 200. Respective ones of the dummy vertical channel structures DVS may penetrate one of the first to fourth stack structures ST1 to ST4. For example, the dummy vertical channel structures DVS may be arranged in a zigzag fashion along the second direction Y. Each of the dummy vertical channel structures DVS may include a dummy gate dielectric layer 335', a dummy semiconductor pillar SP', a dummy charge storage structure 310', a dummy vertical channel VC', a dummy gap-fill layer 320', and a dummy pad 330'. The dummy vertical channel VC' may extend in the third direction Z on the top surface of the second substrate 200 and may penetrate one of the first to fourth stack structures ST1 to ST4. The dummy vertical channel VC' may include the same material as that of the vertical channel VC. The dummy semiconductor pillar SP' may be disposed between the second substrate 200 and the dummy vertical channel VC' and may penetrate the ground select gate electrode 220a. The dummy semiconductor pillar SP' may include the same material as that of the semiconductor pillar SP. The dummy gate dielectric layer 335' may be disposed between the dummy semiconductor pillar SP' and the ground select gate electrode 220a. The dummy gate dielectric layer 335' may include the same material as that of the gate dielectric layer 335. The dummy charge storage structure 310' may surround an outer wall of the dummy vertical channel VC'. The dummy charge storage structure 310' may include the same material as that of the charge storage structure 310. The dummy gap-fill layer 320' may be disposed in an inner space of the dummy vertical channel VC'. The dummy pad 330' may be disposed on a top surface of the dummy vertical channel VC'. The dummy pad 330' may include the same material as that of the pad 330.

A through dielectric pattern 410 may be disposed on the pad region 20 of the second substrate 200. For example, when viewed in plan, the through dielectric pattern 410 may be disposed in the uppermost cell gate electrode 220b_1 of the first stack structure ST1 of the first memory block BLK1 and also in the uppermost cell gate electrode 220b_1 of the first stack structure ST1 of the second memory block BLK2, which uppermost cell gate electrodes 220b_1 are located at the same level. The through dielectric pattern 410 may penetrate the interlayer dielectric pattern 300, the first stack structure ST1 of the first memory block BLK1, the first stack structure ST1 of the second memory block BLK2, and the second substrate 200. The through dielectric pattern 410 may be disposed on a top surface of the first interlayer dielectric layer 110. The through dielectric pattern 410 may have lateral surfaces inclined with respect to the top surface of the second substrate 200.

The through dielectric pattern 410 may include, for example, high density plasma (HDP) oxide, tetraethylorthosilicate (TEOS), plasma enhanced tetraethylorthosilicate (PE-TEOS), O3-tetratthylorthosilicate (O$_3$-TEOS), undoped silicate glass (USG), phosphosilicate glass (PSG), borosilicate glass (BSG), borophosphosilicate glass (BPSG), fluorosilicate glass (FSG), spin on glass (SOG), tonen silazene (TOSZ), or a combination thereof.

A second interlayer dielectric layer 450 may be disposed on the first to fourth stack structures ST1 to ST4 and the interlayer dielectric patterns 300. The second interlayer dielectric layer 450 may be on and, in some embodiments, cover the top surface of the interlayer dielectric pattern 300 and top surfaces of the first to fourth stack structures ST1 to ST4. The second interlayer dielectric layer 450 may include, for example, a silicon oxide layer.

Contact structures 470 may be disposed between the first to fourth stack structures ST1 to ST4 adjacent to each other in the first direction X. The contact structure 470 may extend in the second direction Y and may penetrate the second interlayer dielectric layer 450. When viewed in plan, each of the contact structures 470 may have a rectangular and/or linear shape extending in the second direction Y. In some embodiments, the contact structures 470 may be arranged in the second direction Y along the common source regions CSR. In this case, each of the contact structures 470 may have a pillar shape.

The through dielectric pattern 410 may separate the contact structure 470 that is disposed between the first stack structure ST1 of the first memory block BLK1 and the first stack structure ST1 of the second memory block BLK2 into pieces in the second direction Y. For example, the through dielectric pattern 410 may penetrate the contact structure 470 disposed between the first stack structure ST1 of the first memory block BLK1 and the first stack structure ST1 of the second memory block BLK2. The string select gate electrodes 220c adjacent in the first direction X of the first to fourth stack structures ST1 to ST4 may be separated from one another by a plurality of contact structures 470 disposed between the string select gate electrodes 220c.

Each of the contact structures 470 may include a spacer 471 and a common source contact 473. The common source contact 473 may be electrically connected to the common source region CSR. The common source contact 473 may include, for example, a metal (e.g., tungsten, copper, and/or aluminum) and/or a transition metal (e.g., titanium or tantalum). The spacer 471 may surround an outer wall of the common source contact 473. The spacer 471 may include, for example, a dielectric material such as a silicon oxide layer and/or a silicon nitride layer.

First to fourth cell connectors CE1 to CE4 may be disposed between the first to fourth stack structures ST1 to ST4 that are adjacent to each other on each of the first and second memory blocks BLK1 and BLK2. When viewed in plan, on each of the first and second memory blocks BLK1 and BLK2, the first and second cell connectors CE1 and CE2 may be disposed between the uppermost cell gate electrode 220b_1 of the first stack structure ST1 and the uppermost cell gate electrode 220b_1 of the second stack structure ST2. When viewed in plan, the first cell connector CE1 may be spaced apart from the through dielectric pattern 410 and adjacent to the string select gate electrode 220c. In some embodiments, the first cell connector CE1 may be closer, in the second direction Y, to the string select gate electrode 220c than the through dielectric pattern 410 is to the string select gate electrode 220c. When viewed in plan, the second cell connector CE2 may be spaced apart from the through dielectric pattern 410 and adjacent to the cell gate electrode 220b below (e.g., directly below) the uppermost cell gate electrode 220b_1. In some embodiments, the second cell connector CE2 may be closer, in the second direction Y, to the cell gate electrode 220b below (e.g., directly below) the uppermost cell gate electrode 220b_1 than the through dielectric pattern 410 is thereto. In some embodiments, a line extending (e.g., a virtual line) in the first direction X from the through dielectric pattern 410 may extend between the first cell connector CE1 and the second cell connector CE2. The first and second cell connectors CE1 and CE2 may mutually connect the uppermost cell gate electrodes 220b_1 at the same level of the first and second structures ST1 and ST2, and this description may also be applicable to the cell gate electrodes 220b and the dielectric patterns 230 of the first and second stack structures ST1 and ST2. Lowermost dielectric patterns 230 of the first and second stack structures ST1 and ST2 may extend into first parts P1 (see, e.g., FIG. 6) between the ground select gate electrode 220a of the first stack structure ST1 and the ground select gate electrode 220a of the second stack structure ST2. The first parts P1 may vertically overlap the first and second cell connectors CE1 and CE2. Thus, the ground select gate electrode 220a of the first stack structure ST1 may be separated from the ground select gate electrode 220a of the second stack structure ST2.

When viewed in plan, on each of the first and second memory blocks BLK1 and BLK2, the third cell connector CE3 may be disposed between the uppermost cell gate electrode 220b_1 of the second stack structure ST2 and the uppermost cell gate electrode 220b_1 of the third stack structure ST3. The third cell connector CE3 may mutually connect the uppermost cell gate electrodes 220b_1 at the same level of the second and third stack structures ST2 and ST3, and this description may also be applicable to the cell gate electrodes 220b and the dielectric patterns 230 of the second and third stack structures ST2 and ST3. When viewed in plan, the third cell connector CE3 may be adjacent to the cell gate electrode 220b below (e.g., directly below) the uppermost cell gate electrode 220b_1. Lowermost dielectric patterns 230 of the second and third stack structures ST2 and ST3 may extend into a second part (not shown) between the ground select gate electrode 220a of the second stack structure ST2 and the ground select gate electrode 220a of the third stack structure ST3. The second part may vertically overlap the third cell connector CE3. Thus, the ground select gate electrode 220a of the second stack structure ST2 may be separated from the ground select gate electrode 220a of the third stack structure ST3.

When viewed in plan, on each of the first and second memory blocks BLK1 and BLK2, the fourth cell connector CE4 may be disposed between the uppermost cell gate electrode 220b_1 of the third stack structure ST3 and the uppermost cell gate electrode 220b_1 of the fourth stack structure ST4. The fourth cell connector CE4 may mutually connect the uppermost cell gate electrodes 220b_1 at the same level of the third and fourth stack structures ST3 and ST4, and this description may also be applicable to the cell gate electrodes 220b and the dielectric patterns 230 of the third and fourth stack structures ST3 and ST4. When viewed in plan, the fourth cell connector CE4 may be adjacent to the cell gate electrode 220b below (e.g., directly below) the uppermost cell gate electrode 220b_1. Lowermost dielectric patterns 230 of the third and fourth stack structures ST3 and ST4 may extend into a third part (not shown) between the ground select gate electrode 220a of the third stack structure ST3 and the ground select gate electrode 220a of the fourth stack structure ST4. Thus, the ground select gate electrode 220a of the third stack structure ST3 may be separated from the ground select gate electrode 220a of the fourth stack structure ST4.

The second to fourth cell connectors CE2 to CE4 may be linearly arranged in the first direction X. The first to fourth cell connectors CE4 may mutually connect the uppermost cell gate electrodes 220b_1 at the same level of the first to fourth stack structures ST1 to ST4, and also mutually connect the cell gate electrodes 220b at the same level of the first to fourth stack structures ST1 to ST4. No cell connector may be disposed between the first stack structure ST1 of the first and second memory blocks BLK1 and BLK2, which first stack structures ST1 are adjacent to each other in the first direction X. Therefore, no electrical connection may exist between the first memory block BLK1 and the second memory block BLK2.

A plurality of first supporters SPP1 may be disposed between the second and third stack structures ST2 and ST3 of each of the first and second memory blocks BLK1 and BLK2. A plurality of second supporters SPP2 may be disposed between the third and fourth stack structures ST3 and ST4 of each of the first and second memory blocks BLK1 and BLK2. The number of the plurality of first supporters SPP1 may be greater than that of the plurality of second supporters SPP2.

The plurality of first supporters SPP1 may include first, second, fifth, and sixth support connectors SE1, SE2, SE5, and SE6. When viewed in plan, on each of the first and second memory blocks BLK1 and BLK2, the first, second, fifth, and sixth support connectors SE1, SE2, SE5, and SE6 may be disposed between the uppermost cell gate electrode 220b_1 of the second stack structure ST2 and the uppermost cell gate electrode 220b_1 of the third stack structure ST3. The first, second, fifth, and sixth support connectors SE1, SE2, SE5, and SE6 may mutually connect the uppermost cell gate electrodes 220b_1 at the same level of the second and third stack structures ST2 and ST3, and this description may also be applicable to the cell gate electrodes 220b and the dielectric patterns 230 of the second and third stack structures ST2 and ST3. When viewed in plan, the first, second, fifth, and sixth support connectors SE1, SE2, SE5, and SE6 may be disposed to face in the first direction X toward the through dielectric pattern 410. In some embodiments, the first, second, fifth and sixth support connectors SE1, SE2, SE5, and SE6 may be disposed on an opposite side of the second stack structure ST2 from the through dielectric pattern 410.

The plurality of second supporters SPP2 may include third and fourth support connectors SE3 and SE4. When viewed in plan, on each of the first and second memory blocks BLK1 and BLK2, the third and fourth support connectors SE3 and SE4 may be disposed between the uppermost cell gate electrode 220b_1 of the third stack structure ST3 and the uppermost cell gate electrode 220b_1 of the fourth stack structure ST4. The third and fourth support connectors SE3 and SE4 may mutually connect the uppermost cell gate electrodes 220b_1 at the same level of the third and fourth stack structures ST3 and ST4, and this description may also be applicable to the cell gate electrodes 220b and the dielectric patterns 230 of the third and fourth stack structures ST3 and ST4. When viewed in plan, the third and fourth support connectors SE3 and SE4 may be disposed to face in the first direction X toward the through dielectric pattern 410. In some embodiments, the third and fourth support connectors SE3 and SE4 may be disposed on an opposite side of the third stack structure ST3 from the first, second, fifth and sixth support connectors SE1, SE2, SE5, and SE6. In some embodiments, because the cell gate electrodes 220b and 220b_1 of the third and fourth stack structures ST3 and ST4 are connected by the third and fourth support connectors SE3 and SE4, it may be unnecessary to provide the third and fourth cell connectors CE3 and CE4 discussed above.

The lowermost dielectric patterns 230 of the second and third stack structures ST2 and ST3 may extend into fourth parts P4 (see, e.g., FIG. 6) between the ground select gate electrode 220a of the second stack structure ST2 and the ground select gate electrode 220a of the third stack structure ST3. The fourth parts P4 may vertically overlap the first, second, fifth, and sixth support connectors SE1, SE2, SE5, and SE6, respectively. Thus, the ground select gate electrode 220a of the second stack structure ST2 may be separated from the ground select gate electrode 220a of the third stack structure ST3. The lowermost dielectric patterns 230 of the third and fourth stack structures ST3 and ST4 may extend into fifth parts P5 (see, e.g., FIG. 6) between the ground select gate electrode 220a of the third stack structure ST3 and the ground select gate electrode 220a of the fourth stack structure ST4. The fifth parts P5 may vertically overlap the third and fourth support connectors SE3 and SE4, respectively. Thus, the ground select gate electrode 220a of the third stack structure ST3 may be separated from the ground select gate electrode 220a of the fourth stack structure ST4.

As shown in FIG. 7, the first, second, fifth, and sixth support connectors SE1, SE2, SE5, and SE6 may be linearly arranged in the second direction Y. The third and fourth support connectors SE3 and SE4 may be linearly arranged in the second direction Y. The third support connector SE3 may be disposed shifted in the first direction X between the first support connector SE1 and the second support connector SE2. In some embodiments, a line (e.g., a virtual line) extending in the first direction X from the third support connector SE3 may extend between the first support connector SE1 and the second support connector SE2. The fourth support connector SE4 may be shifted in the first direction X between the fifth support connector SE5 and the sixth support connector SE6. In some embodiments, a line (e.g., a virtual line) extending in the first direction X from the fourth support connector SE4 may extend between the fifth support connector SE5 and the sixth support connector SE6. The second and fifth support connectors SE2 and SE5 may be shifted in the first direction X between the third support connector SE3 and the fourth support connector SE4. In some embodiments, lines (e.g., virtual lines) extending in the first direction X from second and fifth support connectors SE2 and SE5 may respectively extend between the third support connector SE3 and the fourth support connector SE4. A first distance D1 between the first support connector SE1 and the second support connector SE2 may be substantially equal to a second distance D2 between the fifth support connector SE5 and the sixth support connector SE6 (D1=D2). A third distance D3 between the second support connector SE2 and the fifth support connector SE5 may be equal to or greater than the first distance D1 and the second distance D2 (D3≥D1, D3≥D2). A fourth distance D4 between the third support connector SE3 and the fourth support connector SE4 may be different from the first distance D1, the second distance D2, and/or the third distance D3. For example, the fourth distance D4 may be greater than the first distance D1, the second distance D2, and the third distance D3 (D4>D1, D4>D2, D4>D3). A fifth distance D5 between the first support connector SE1 and the sixth support connector SE6 may be greater than the fourth distance D4 (D5>D4). In some embodiments, the first to sixth support connectors SE1 to SE6 may have the same planar area. For example, a sum of the planar areas of the first, second, fifth, and sixth support connectors SE1, SE2, SE5, and SE6 may be greater than a sum of the planar areas of the third and fourth support connectors SE3 and SE4.

A third interlayer dielectric layer 500 may be disposed on the second interlayer dielectric layer 450. The third interlayer dielectric layer 500 may be on, and, in some embodiments, cover a top surface of the second interlayer dielectric layer 450 and a top surface of the contact structure 470. The third interlayer dielectric layer 500 may include, for example, a silicon oxide layer.

Channel contact plugs CCP may be provided on the pads 330 disposed in the first to fourth stack structures ST1 to ST4. The channel contact plugs CCP may penetrate the third and second interlayer dielectric layers 500 and 450 and may have connection with the pads 330. The channel contact plugs CCP may include, for example, one or more of metal (e.g., copper and/or tungsten) and metal nitride (e.g., TiN, TaN, and/or WN).

Cell contact plugs 510 may be disposed on the pad region 20 of the second substrate 200. The cell contact plugs 510 may be disposed on the ends of the gate electrodes 220a, 220b, 220b_1, and 220c of the first to fourth stack structures ST1 to ST4. The cell contact plugs 510 may be connected to the ends of the gate electrodes 220a, 220b, 220b_1, and 220c, respectively. The cell contact plugs 510 may include one or more of metal (e.g., copper and/or tungsten) and/or metal nitride (e.g., TiN, TaN, and/or WN).

As shown in FIG. 8, peripheral contact plugs PCP may be disposed in the through dielectric pattern 410. The peripheral contact plugs PCP may penetrate the through dielectric pattern 410 and may extend into the first interlayer dielectric layer 110. For example, the peripheral contact plugs PCP may be arranged along a circumference of the through dielectric pattern 410. The peripheral contact plugs PCP may be electrically connected to the transistors TR. The peripheral contact plugs PCP may include, for example, one or more of metal (e.g., copper and/or tungsten) and/or metal nitride (e.g., TiN, TaN, and/or WN). The number of the peripheral contact plugs PCP may be different from that shown in figures, and an arrangement of the peripheral contact plugs PCP is not limited to that shown in figures.

Connection lines 520 may be disposed on the third interlayer dielectric layer 500. The connection lines 520 may connect the peripheral contact plugs PCP to the cell contact plugs 510. Bit lines BL may be disposed on the third interlayer dielectric layer 500. The bit lines BL may extend in the first direction X and may run across the first to fourth stack structures ST1 to ST4. The bit lines BL may be spaced apart from each other in the second direction Y on the third interlayer dielectric layer 500.

Figure 10:
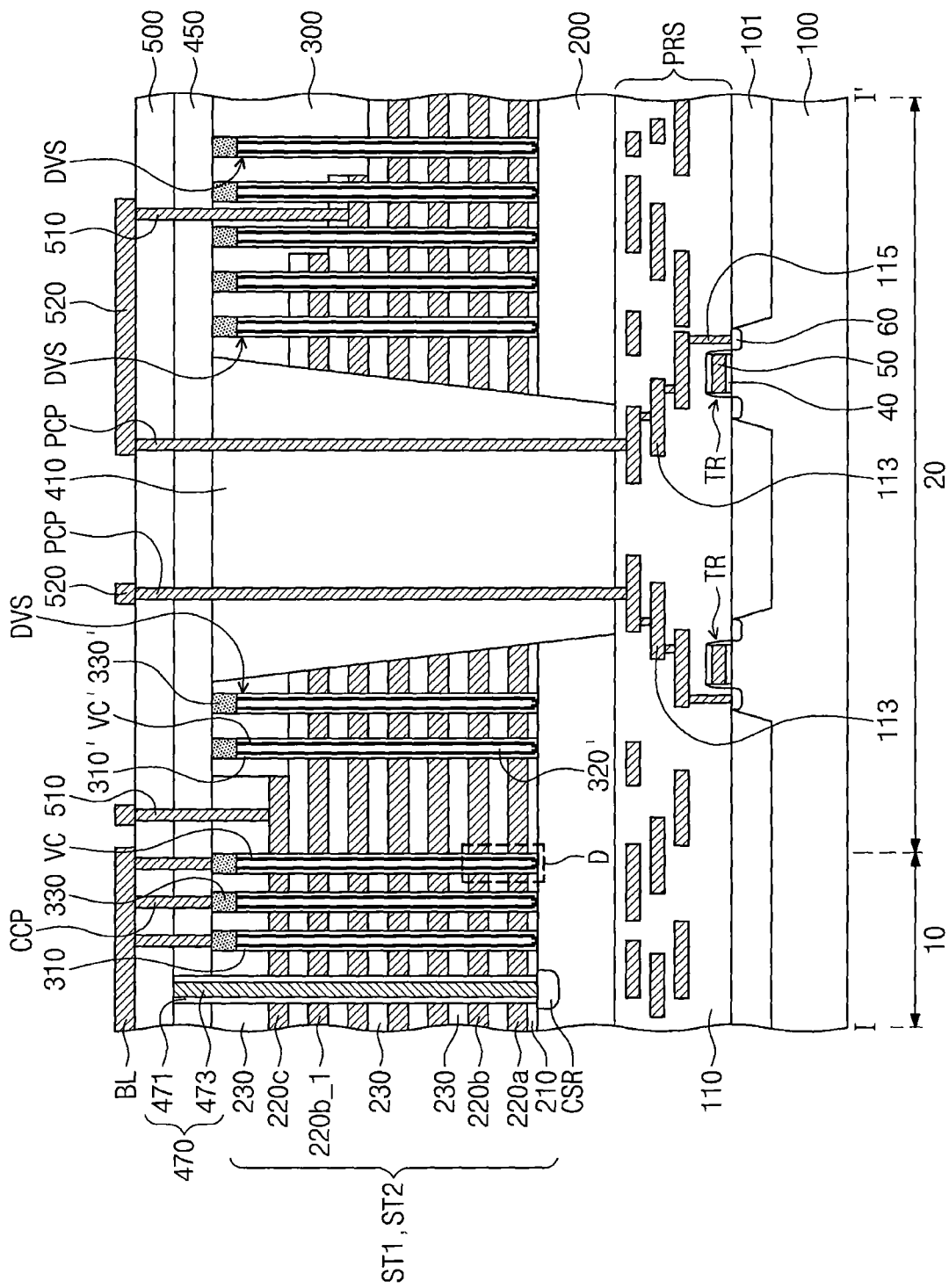
FIG. 10 illustrates a cross-sectional view taken along line I-I' of FIG. 3, showing a three-dimensional semiconductor memory device according to some example embodiments of the present inventive concepts.
Figure 11:
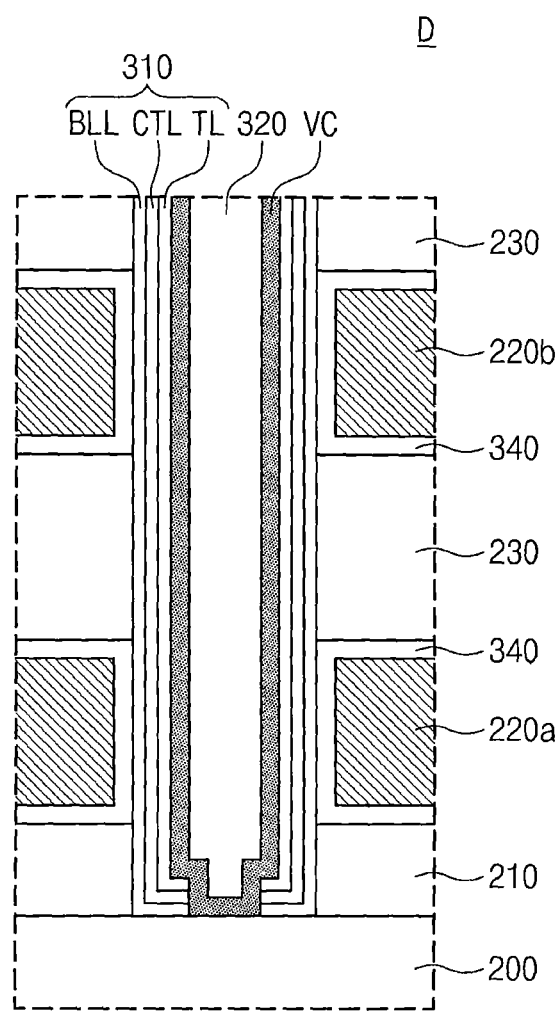
FIG. 11 illustrates an enlarged view of section D of FIG. 10.

FIG. 10 illustrates a cross-sectional view taken along line I-I' of FIG. 3, showing a three-dimensional semiconductor memory device according to some example embodiments of the present inventive concepts. FIG. 11 illustrates an enlarged view of section D of FIG. 10. For brevity of description, components substantially the same as those of the three-dimensional semiconductor memory device discussed with reference to FIGS. 3 to 9 are allocated the same reference numerals thereto, and a repetitive explanation thereof will be omitted.

Referring to FIGS. 10 and 11, the vertical channels VC and the charge storage structures 310 may contact the top surface of the second substrate 200. In addition, the dummy vertical channels VC' and the dummy charge storage structures 310' may contact the top surface of the second substrate 200. For example, the present embodiment may not include the semiconductor pillar SP, the dummy semiconductor pillar SP', the gate dielectric layer 335, and the dummy gate dielectric layer 335' discussed with reference to FIGS. 4 and 9.

Figure 12:
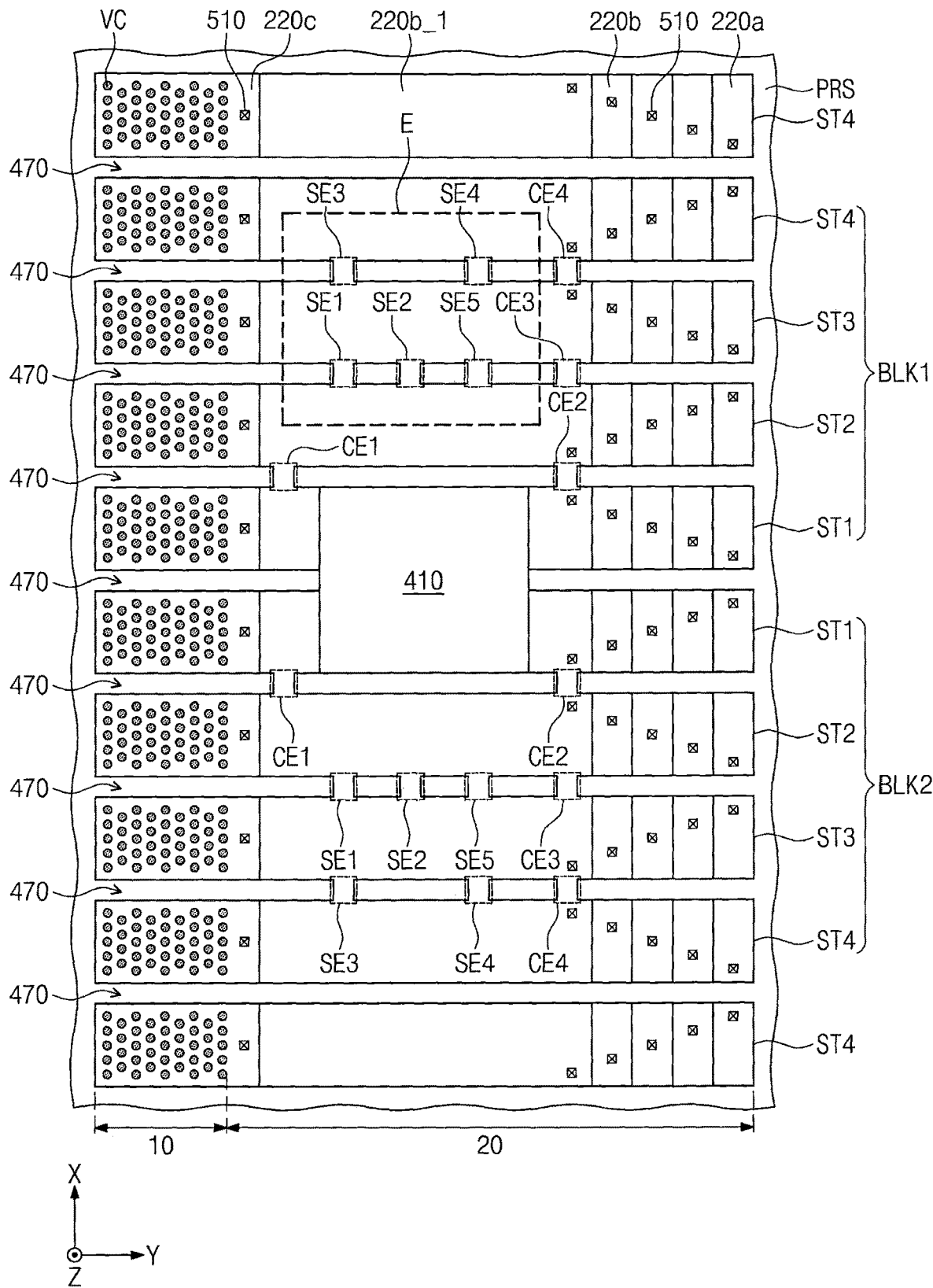
FIG. 12 illustrates a plan view showing a three-dimensional semiconductor memory device according to some example embodiments of the present inventive concepts.
Figure 13:
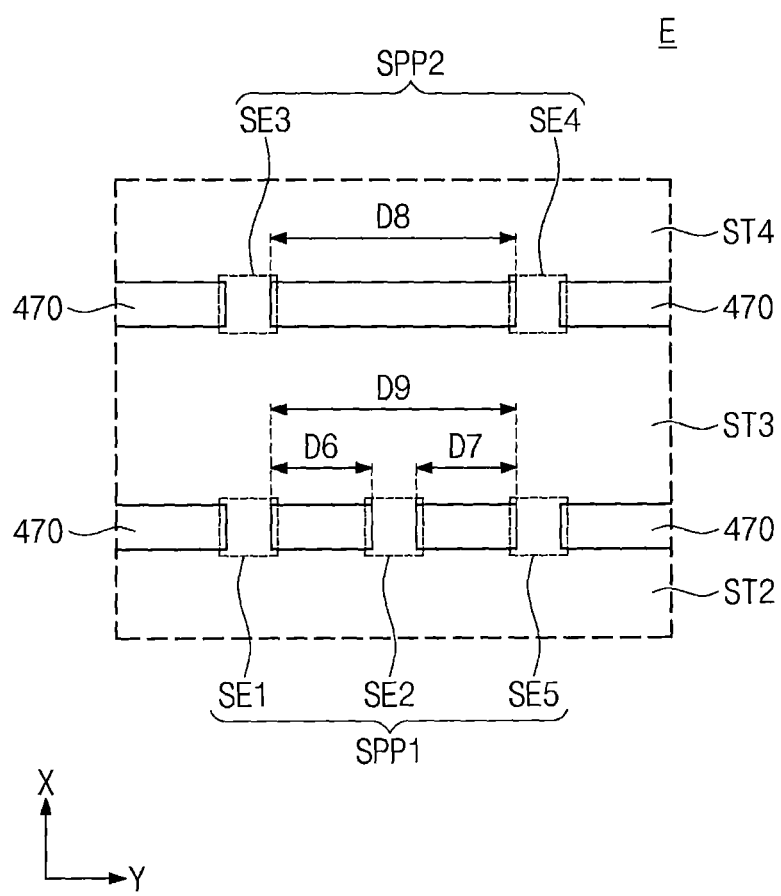
FIG. 13 illustrates an enlarged view of section E of FIG. 12.

FIG. 12 illustrates a plan view showing a three-dimensional semiconductor memory device according to some example embodiments of the present inventive concepts. FIG. 13 illustrates an enlarged view of section E of FIG. 12. For brevity of description, components substantially the same as those of the three-dimensional semiconductor memory device discussed with reference to FIGS. 3 to 9 are allocated the same reference numerals thereto, and a repetitive explanation thereof will be omitted.

Referring to FIGS. 12 and 13, a plurality of first supporters SPP1 may be disposed between the second and third stack structures ST2 and ST3 of each of the first and second memory blocks BLK1 and BLK2. A plurality of second supporters SPP2 may be disposed between the third and fourth stack structures ST3 and ST4 of each of the first and second memory blocks BLK1 and BLK2. The number of the first supporters SPP1 may be greater than that of the second supporters SPP2.

The plurality of first supporters SPP1 may include first, second, and fifth support connectors SE1, SE2, and SE5. When viewed in plan, on each of the first and second memory blocks BLK1 and BLK2, the first, second, and fifth support connectors SE1, SE2, and SE5 may be disposed between the uppermost cell gate electrode 220b_1 of the second stack structure ST2 and the uppermost cell gate electrode 220b_1 of the third stack structure ST3. The first, second, and fifth support connectors SE1, SE2, and SE5 may be sequentially arranged in the second direction Y. The second support connector SE2 may be disposed between the first support connector SE1 and the fifth support connector SE5. The first, second, and fifth support connectors SE1, SE2, and SE5 may mutually connect the uppermost cell gate electrodes 220b_1 at the same level of the second and third stack structures ST2 and ST3, and this description may also be applicable to the cell gate electrodes 220b and the dielectric patterns 230 of the second and third stack structures ST2 and ST3.

The plurality of second supporters SPP2 may include third and fourth support connectors SE3 and SE4. When viewed in plan, on each of the first and second memory blocks BLK1 and BLK2, the third and fourth support connectors SE3 and SE4 may be disposed between the uppermost cell gate electrode 220b_1 of the third stack structure ST3 and the uppermost cell gate electrode 220b_1 of the fourth stack structure ST4. The third and fourth support connectors SE3 and SE4 may be sequentially arranged in the second direction Y. The third and fourth support connectors SE3 and SE4 may mutually connect the uppermost cell gate electrodes 220b_1 at the same level of the third and fourth stack structures ST3 and ST4, and this description may also be applicable to the cell gate electrodes 220b and the dielectric patterns 230 of the third and fourth stack structures ST3 and ST4.

The first support connector SE1 and the third support connector SE3 may be disposed to face each other in the first direction X. In some embodiments, the first support connector SE1 and the third support connector SE3 may be substantially collinear in the first direction X. In some embodiments, portions of the first support connector SE1 and the third support connector SE3 may overlap one another in the first direction X. The fourth support connector SE4 and the fifth support connector SE5 may be disposed to face each other in the first direction X. In some embodiments, the fourth support connector SE4 and the fifth support connector SE5 may be substantially collinear in the first direction X. In some embodiments, portions of the fourth support connector SE4 and the fifth support connector SE5 may overlap one another in the first direction X. A sixth distance D6 between the first support connector SE1 and the second support connector SE2 may be substantially equal to a seventh distance D7 between the second support connector SE2 and the fifth support connector SE5 (D6=D7). An eighth distance D8 between the third support connector SE3 and the fourth support connector SE4 may be greater than the sixth distance D6 and the seventh distance D7 (D8>D6, D8>D7). The eighth distance D8 may be substantially equal to a ninth distance D9 between the first support connector SE1 and the fifth support connector SE5 (D8=D9). In some embodiments, the first to fifth support connectors SE1 to SE5 may have the same planar area. For example, a sum of the planar areas of the first, second, and fifth support connectors SE1, SE2, and SE5 may be greater than a sum of the planar areas of the third and fourth support connectors SE3 and SE4.

Figure 14:
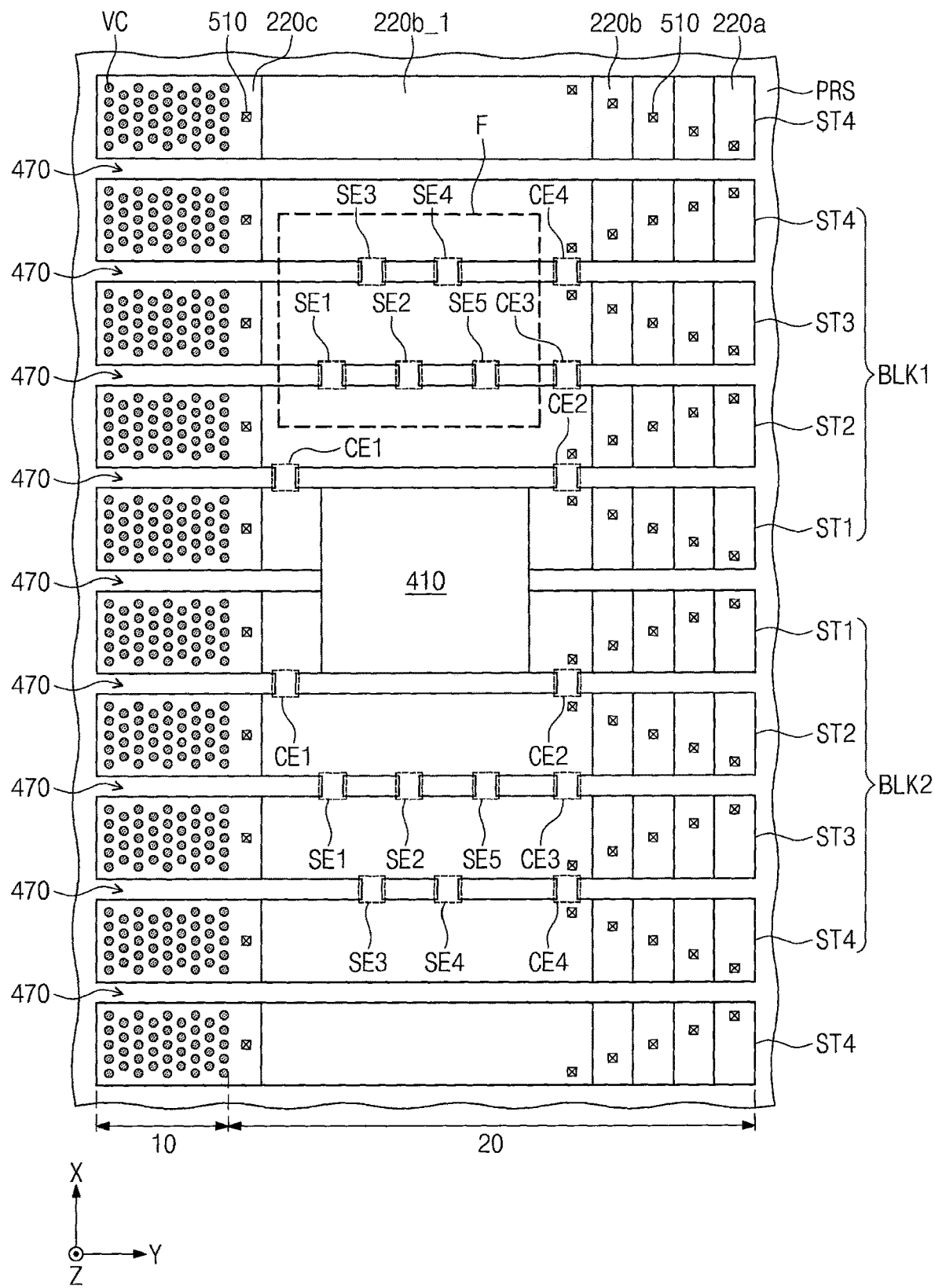
FIG. 14 illustrates a plan view showing a three-dimensional semiconductor memory device according to some example embodiments of the present inventive concepts.
Figure 15:
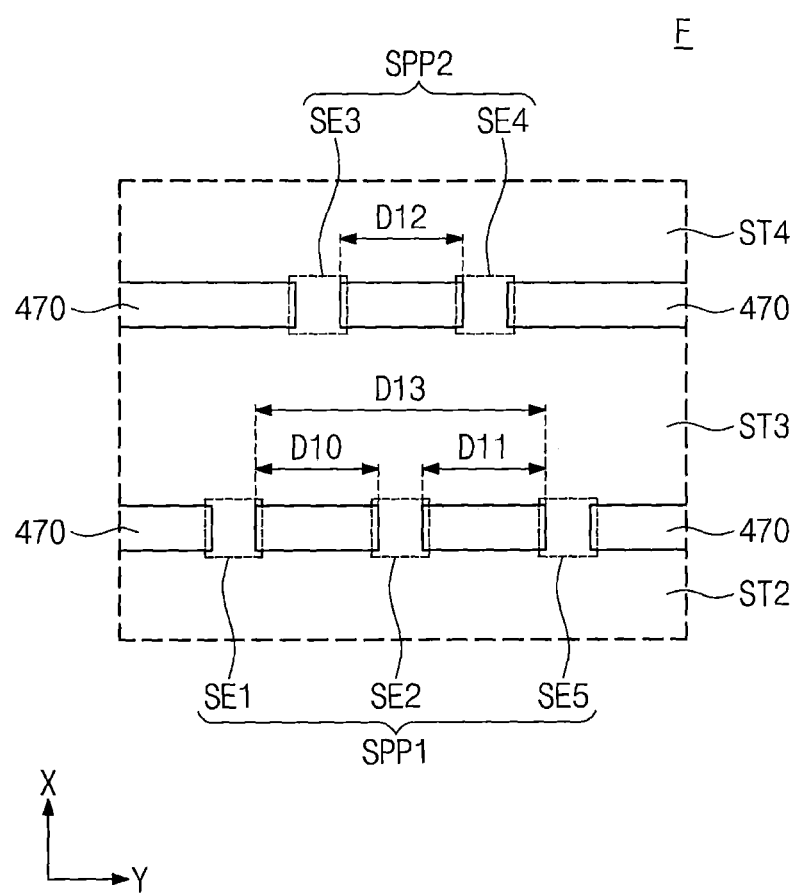
FIG. 15 illustrates an enlarged view of section F of FIG. 14.

FIG. 14 illustrates a plan view showing a three-dimensional semiconductor memory device according to some example embodiments of the present inventive concepts. FIG. 15 illustrates an enlarged view of section F of FIG. 14. For brevity of description, components substantially the same as those of the three-dimensional semiconductor memory device discussed with reference to FIGS. FIGS. 3 to 9, 12, and 13 are allocated the same reference numerals thereto, and a repetitive explanation thereof will be omitted.

Referring to FIGS. 14 and 15, the third support connector SE3 may be shifted in the second direction Y between the first support connector SE1 and the second support connector SE2. In some embodiments, lines extending in the first direction X from the third support connector SE3 may extend between the first support connector SE1 and the second support connector SE2. The fourth support connector SE4 may be shifted in the second direction Y between the second support connector SE2 and the fifth support connector SE5. In some embodiments, lines extending in the first direction X from the fourth support connector SE4 may extend between the second support connector SE2 and the fifth support connector SE5. The first support connector SE1, the third support connector SE3, the second support connector SE2, the fourth support connector SE4, and the fifth support connector SE5 may be sequentially arranged in a zigzag fashion along the second direction Y.

A tenth distance D10 between the first support connector SE1 and the second support connector SE2 may be substantially equal to an eleventh distance D11 between the second support connector SE2 and the fifth support connector SE5 (D10=D11). The eleventh distance D11 may be substantially equal to a twelfth distance D12 between the third support connector SE3 and the fourth support connector SE4 (D11=D12). For example, the tenth distance D10, the eleventh distance D11, and the twelfth distance D12 may be the same as each other (D10=D11=D12). A thirteenth distance D13 between the first support connector SE1 and the fifth support connector SE5 may be greater than the twelfth distance D12 (D13>D12). In some embodiments, the first to fifth support connectors SE1 to SE5 may have the same planar area. For example, a sum of the planar areas of the first, second, and fifth support connectors SE1, SE2, and SE5 may be greater than a sum of the planar areas of the third and fourth support connectors SE3 and SE4.

Figure 16:
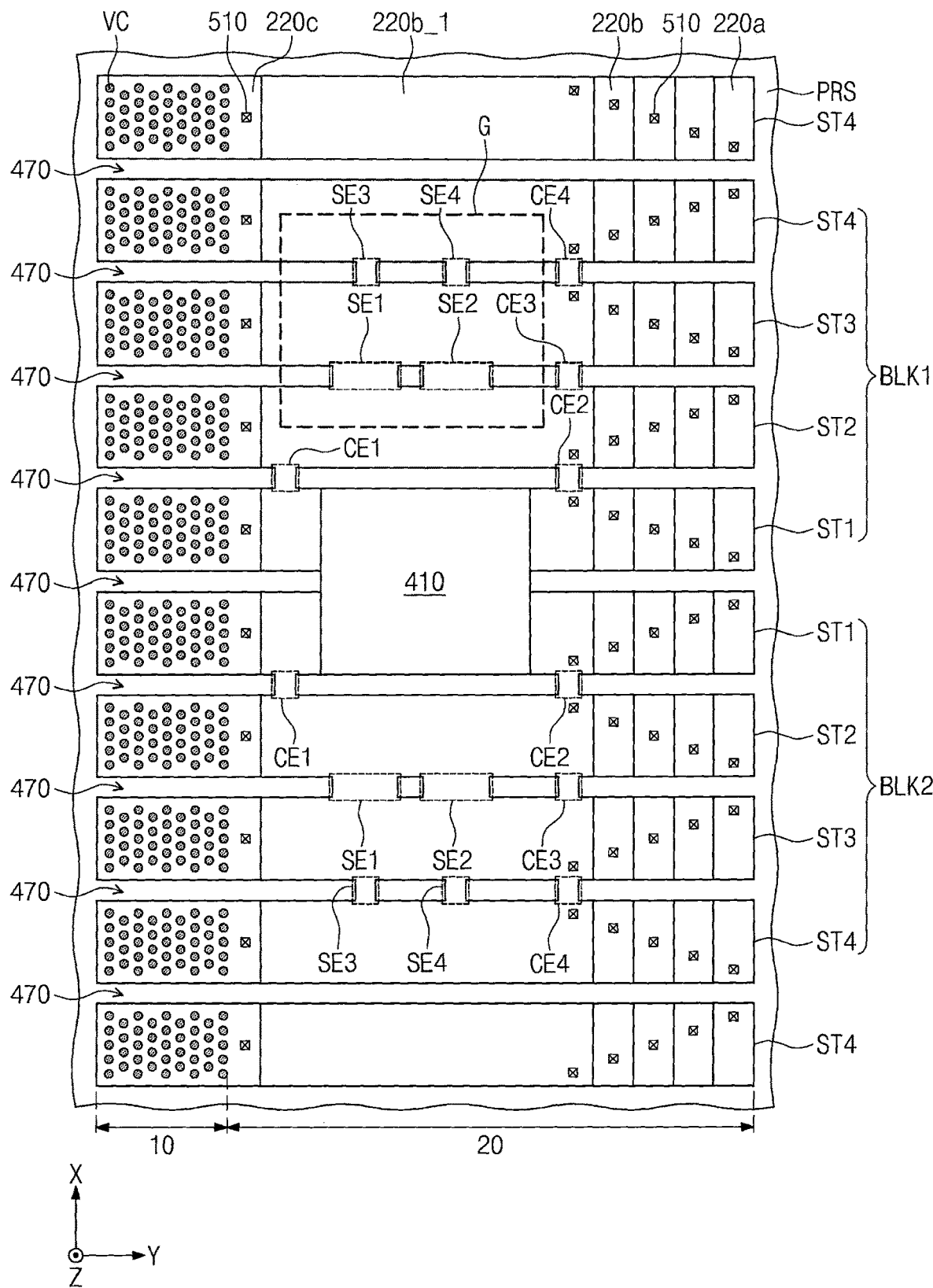
FIG. 16 illustrates a plan view showing a three-dimensional semiconductor memory device according to some example embodiments of the present inventive concepts.
Figure 17:
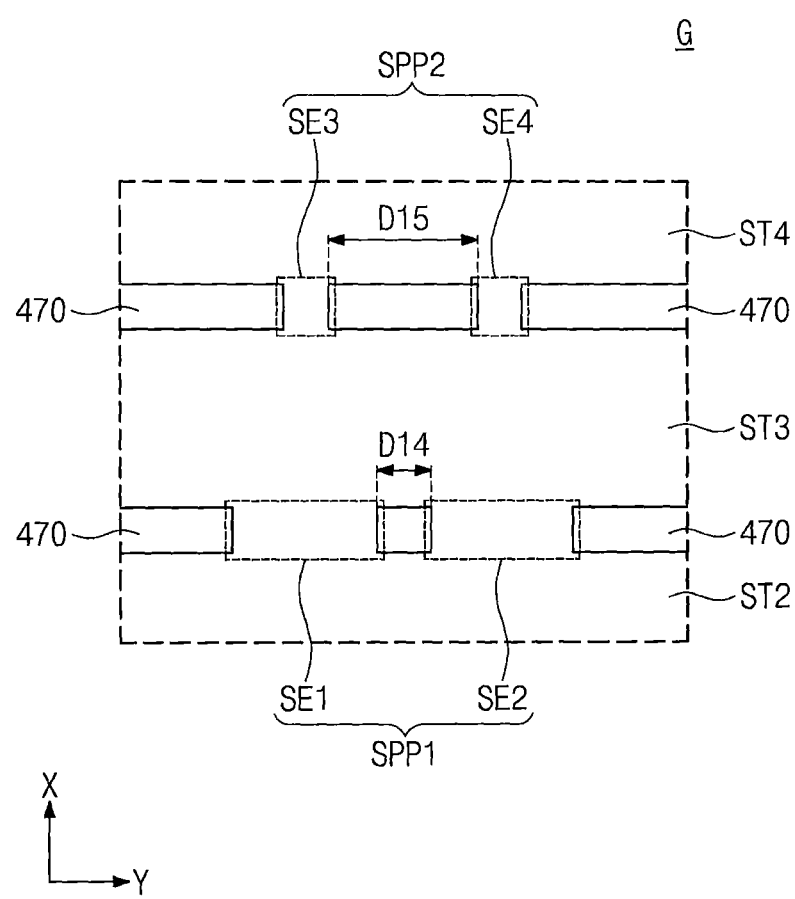
FIG. 17 illustrates an enlarged view of section G of FIG. 14.

FIG. 16 illustrates a plan view showing a three-dimensional semiconductor memory device according to some example embodiments of the present inventive concepts. FIG. 17 illustrates an enlarged view of section G of FIG. 14. For brevity of description, components substantially the same as those of the three-dimensional semiconductor memory device discussed with reference to FIGS. 3 to 9 are allocated the same reference numerals thereto, and a repetitive explanation thereof will be omitted.

Referring to FIGS. 16 and 17, a plurality of first supporters SPP1 may be disposed between the second and third stack structures ST2 and ST3 of each of the first and second memory blocks BLK1 and BLK2. A plurality of second supporters SPP2 may be disposed between the third and fourth stack structures ST3 and ST4 of each of the first and second memory blocks BLK1 and BLK2. The number of the plurality of first supporters SPP1 may be the same as that of the plurality of second supporters SPP2.

The plurality of first supporters SPP1 may include a first support connector SE1 and a second support connector SE2. When viewed in plan, on each of the first and second memory blocks BLK1 and BLK2, the first and second support connectors SE1 and SE2 may be disposed between the uppermost cell gate electrode 220$b$_1 of the second stack structure ST2 and the uppermost cell gate electrode 220$b$_1 of the third stack structure ST3. The first and second support connectors SE1 and SE2 may mutually connect the uppermost cell gate electrodes 220$b$_1 at the same level of the second and third stack structures ST2 and ST3, and this description may also be applicable to the cell gate electrodes 220$b$ and the dielectric patterns 230 of the second and third stack structures ST2 and ST3. The plurality of second supporters SPP2 may include third and fourth support connectors SE3 and SE4. When viewed in plan, on each of the first and second memory blocks BLK1 and BLK2, the third and fourth support connectors SE3 and SE4 may be disposed between the uppermost cell gate electrode 220$b$_1 of the third stack structure ST3 and the uppermost cell gate electrode 220$b$_1 of the fourth stack structure ST4. The third and fourth support connectors SE3 and SE4 may mutually connect the uppermost cell gate electrodes 220$b$_1 at the same level of the third and fourth stack structures ST3 and ST4, and this description may also be applicable to the cell gate electrodes 220$b$ and the dielectric patterns 230 of the third and fourth stack structures ST3 and ST4.

The first support connector SE1 and the third support connector SE3 may be disposed to face each other in the first direction X. In some embodiments, portions of the first support connector SE1 and the third support connector SE3 may overlap one another in the first direction X. The second support connector SE2 and the fourth support connector SE4 may be disposed to face each other in the first direction X. In some embodiments, portions of the second support connector SE2 and the fourth support connector SE4 may overlap one another in the first direction X. A fourteenth distance D14 between the first support connector SE1 and the second support connector SE2 may be less than a fifteenth distance D15 between the third support connector SE3 and the fourth support connector SE4 (D14<D15). The first and second support connectors SE1 and SE2 may have the same planar area. The third and fourth support connectors SE3 and SE4 may have the same planar area. The planar area of each of the first and second support connectors SE1 and SE2 may be greater than the planar area of each of the third and fourth support connectors SE3 and SE4. For example, a sum of the planar areas of the first and second support connectors SE1 and SE2 may be greater than a sum of the planar areas of the third and fourth support connectors SE3 and SE4.

FIGS. 18 to 20 and 23 illustrate cross-sectional views taken along line I-I' of FIG. 3, showing a method of fabricating a three-dimensional semiconductor memory device according to some example embodiments of the present inventive concepts. FIGS. 21 and 24 illustrate cross-sectional views taken along line II-II' of FIG. 3, showing a method of fabricating a three-dimensional semiconductor memory device according to some example embodiments of the present inventive concepts. FIG. 22 illustrates a plan view showing a method of fabricating a three-dimensional semiconductor memory device according to some example embodiments of the present inventive concepts.

Figure 18:
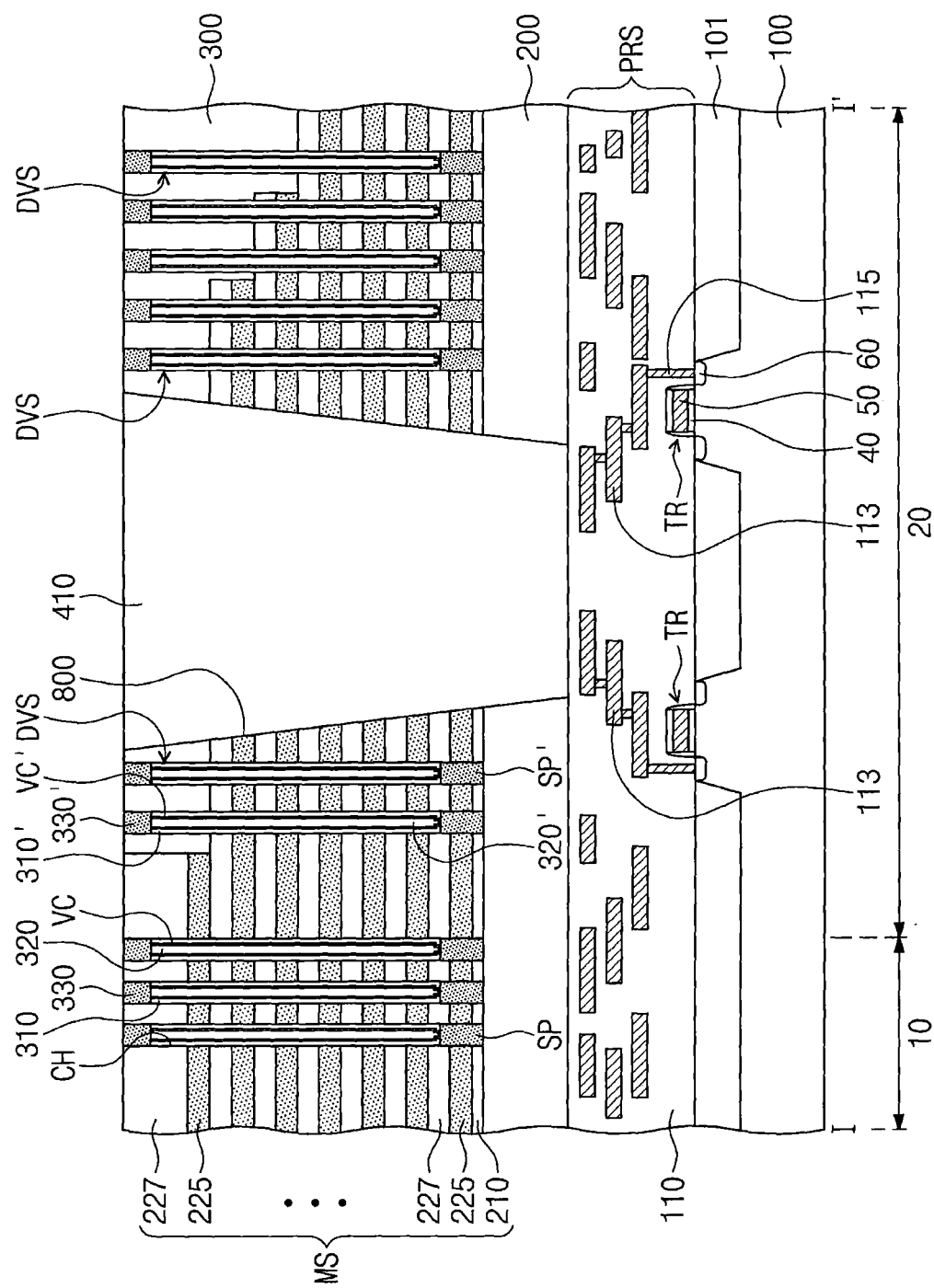
FIGS. 18 to 20 and 23 illustrate cross-sectional views taken along line I-I' of FIG. 3, showing a method of fabricating a three-dimensional semiconductor memory device according to some example embodiments of the present inventive concepts.

Referring to FIG. 18, a device isolation layer 101 may be provided in a first substrate 100. The device isolation layer 101 may define active regions of the first substrate 100.

A peripheral circuit structure PRS may be provided on the first substrate 100. The peripheral circuit structure PRS may include transistors TR, connection lines 113, vias 115, and a first interlayer dielectric layer 110. The transistors TR may be formed on the active regions of the first substrate 100. The transistors TR may each include a peripheral gate dielectric layer 40, a peripheral gate electrode 50, and source/drain regions 60. The peripheral gate dielectric layer 40 and the peripheral gate electrode 50 may be sequentially formed on the first substrate 100. The source/drain regions 60 may be formed in the active regions of the first substrate 100 on opposite sides of the peripheral gate electrode 50.

The first interlayer dielectric layer 110 may be formed on the first substrate 100. The first interlayer dielectric layer 110 may cover the transistors TR. The first interlayer dielectric layer 110 may include, for example, a silicon oxide layer. The connection lines 113 and the vias 115 may be formed in the first interlayer dielectric layer 110.

A second substrate 200 may be provided on the peripheral circuit structure PRS. The second substrate 200 may include a cell array region 10 and a pad region 20. A mold structure MS may be formed on the second substrate 200. The formation of the mold structure MS may include forming a buffer dielectric layer 210 on the second substrate 200, and then alternately and repeatedly stacking sacrificial layers 225 and dielectric layers 227 on the buffer dielectric layer 210. The buffer dielectric layer 210 may include, for example, a thermal oxide layer and/or a silicon oxide layer. The sacrificial layers 225 may include, for example, a silicon nitride layer. The dielectric layers 227 may be formed of a material having an etch selectivity with respect to the sacrificial layers 225. The dielectric layers 227 may include, for example, a silicon oxide layer.

For example, after a lowermost sacrificial layer 225 is formed, the lowermost sacrificial layer 225 may be patterned to form through holes (not shown) therein. The through holes (not shown) may be formed on locations that are overlapped with first to fourth cell connectors CE1 to CE4 which will be discussed below and with first to sixth support connectors SE1 to SE6 which will be discussed below. The through holes (not shown) may partially expose a top surface of the buffer dielectric layer 210. A lowermost dielectric layer 227, formed on a top surface of the lowermost sacrificial layer 225, may fill the through holes of the lowermost sacrificial layer 225.

The mold structure MS may be patterned to have a stepwise structure on the pad region 20 of the second substrate 200. The patterning of the mold structure MS may include forming on the mold structure MS a mask pattern (not shown) exposing a portion of the mold structure MS, which portion is formed on the pad region 20 of the second substrate 200, and then repeatedly performing both an etching process in which the mask pattern is used as an etching mask to etch the dielectric layers 227 and the sacrificial layers 225 and other process in which a width of the mask pattern is reduced to increase etching-target planar areas of the dielectric layers 227 and the sacrificial layers 225. The dielectric layers 227 may be exposed on top surfaces of their ends on the pad region 20 of the second substrate 200. An interlayer dielectric pattern 300 may be formed to cover the buffer dielectric layer 210 and the stepwise structure of the mold structure MS. The interlayer dielectric pattern 300 may expose a top surface of the mold structure MS. The interlayer dielectric pattern 300 may include, for example, a tetraethylorthosilicate (TEOS) oxide layer.

A through hole 800 may be formed in the mold structure MS and the second substrate 200. The formation of the through hole 800 may include forming on the mold structure MS a mask pattern (not shown) having an opening, and then using the mask pattern as an etching mask to anisotropically etch the interlayer dielectric pattern 300, the mold structure MS, and the second substrate 200. The through hole 800 may expose a top surface of the first interlayer dielectric layer 110. The through hole 800 may have lateral surfaces inclined with respect to the top surface of the second substrate 200. A through dielectric pattern 410 may be formed in the through hole 800. The formation of the through dielectric pattern 410 may include filling the through hole 800 with a dielectric material, and then performing on the dielectric material a planarization process to expose the top surface of the mold structure MS. The through dielectric pattern 410 may include, for example, a silicon oxide layer.

The mold structure MS and the buffer dielectric layer 210 may be patterned to form channel holes CH on the cell array region 10 and the pad region 20 of the second substrate 200. For example, the formation of the channel holes CH may include forming a mask pattern (not shown) on the mold structure MS and the interlayer dielectric pattern 300, and then using the mask pattern as an etching mask to anisotropically etch the mold structure MS and the buffer dielectric layer 210. In some embodiments, an over-etching action may be carried out to recess the top surface of the second substrate 200. When viewed in plan, each of the channel holes CH may have a circular, elliptical, or polygonal shape.

Semiconductor pillars SP and dummy semiconductor pillars SP' may be formed in the channel holes CH. The semiconductor pillars SP and the dummy semiconductor pillars SP' may be formed by performing a selective epitaxial growth process in which the second substrate 200 exposed within the channel holes CH is used as a seed layer from which the semiconductor pillars SP and the dummy semiconductor pillars SP' are grown. Charge storage structures 310 and dummy charge storage structures 310' may be formed on sidewalls of the channel holes CH. The charge storage structures 310 and the dummy charge storage structures 310' may be on and, in some embodiments, cover the sidewalls of the channel holes CH, and also be on and, in some embodiments, cover portions of the top surface of the second substrate 200 that are exposed to the channel holes CH. Referring also to FIG. 9, the charge storage structures 310 and the dummy charge storage structures 310' may each include a blocking dielectric layer BLL, a charge storage layer CTL, and a tunnel dielectric layer TL that are sequentially formed on the sidewall of each channel hole CH. For example, the blocking dielectric layer BLL may include a silicon oxide layer and/or a high-k dielectric layer (e.g., $Al_2O_3$ and/or $HfO_2$), the charge storage layer CTL may include a silicon nitride layer, and the tunnel dielectric layer TL may include a silicon oxynitride layer and/or a high-k dielectric layer (e.g., $Al_2O_3$ and/or $HfO_2$).

Vertical channels VC and dummy vertical channels VC' may be formed in the channel holes CH. The vertical channels VC may conformally cover inner walls of the charge storage structures 310 and of the dummy charge storage structures 310', and also conformally cover the top surface of the second substrate 200 exposed by the charge storage structures 310 and the dummy charge storage structures 310'. Gap-fill layers 320 and dummy gap-fill layers 320' may be formed in inner spaces surrounded by the vertical channels VC and the dummy vertical channels VC'. Pads 330 may be formed on upper portions of the vertical channels VC, of the charge storage structures 310, and of the gap-fill layers 320. Dummy pads 330' may be formed on upper portions of the dummy vertical channels VC', of the dummy charge storage structures 310', and of the dummy gap-fill layers 320'. The formation of the pads 330 and the dummy pads 330' may include forming recess regions by etching upper portions of the vertical channels VC, of the dummy vertical channels VC', of the charge storage structures 310, of the dummy charge storage structures 310', of the gap-fill layers 320, and of the dummy gap-fill layers 320', and then filling the recess regions with a conductive material. In some embodiments, the pads 330 and the dummy pads 330' may be formed by doping upper portions of the vertical channels VC and of the dummy vertical channels VC' with impurities whose conductive type is different from that of the vertical channels VC and the dummy vertical channels VC'.

Figure 19:
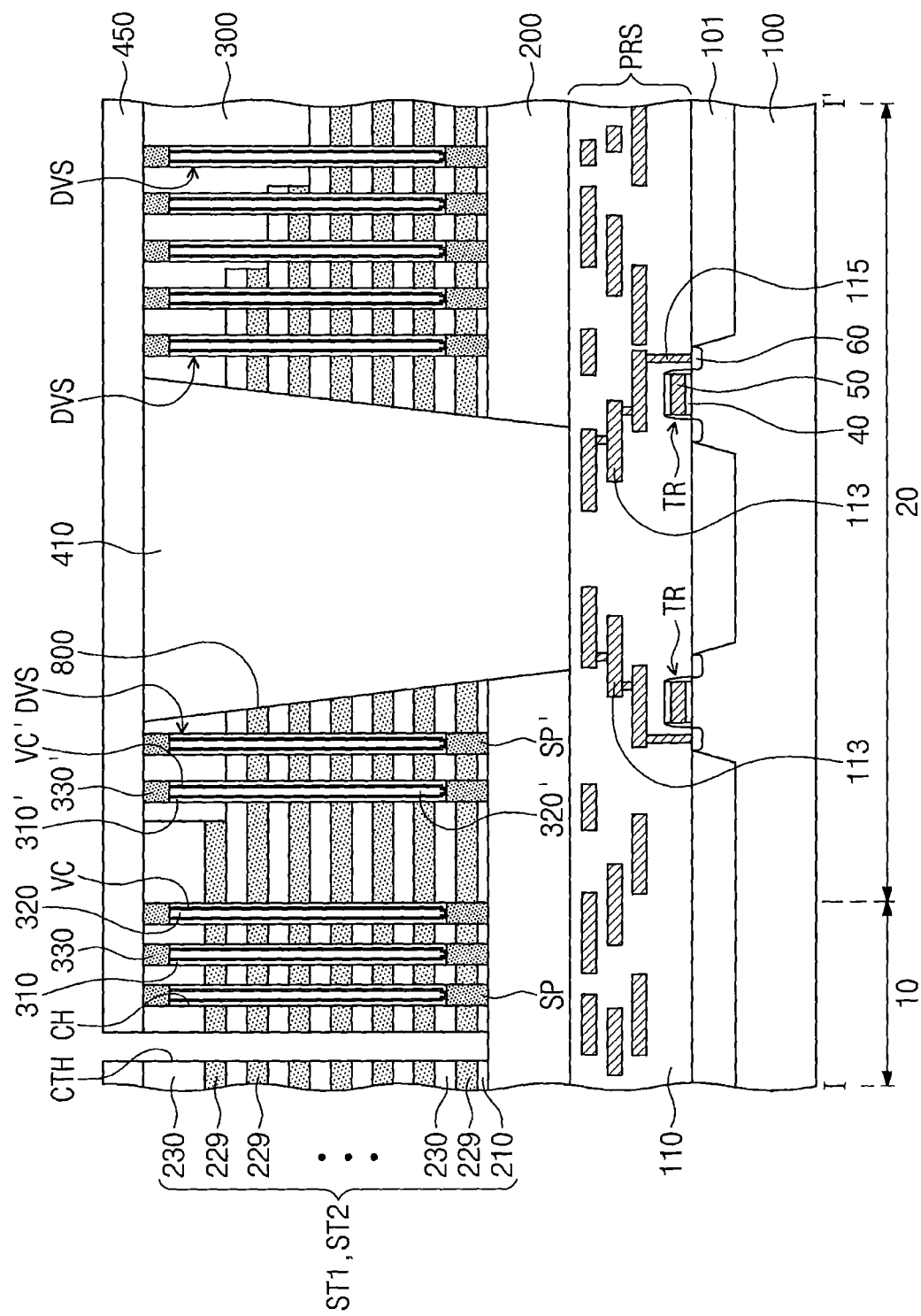

Referring to FIG. 19, the mold structure MS may be anisotropically etched to form a common source trench CTH. The formation of the common source trench CTH may include forming a second interlayer dielectric layer 450 on the mold structure MS, and then using the second interlayer dielectric layer 450 as an etching mask to pattern the mold structure MS and the buffer dielectric layer 210 until the top surface of the second substrate 200 is exposed. A lowermost sacrificial layer 225 may not be etched on its portions filling the through holes (not shown). Therefore, when an etching process is performed to form the common source trench CTH, the mold structure MS may not be etched on its portions that vertically overlap the through holes (not shown) filled with the lowermost sacrificial layer 225. The second interlayer dielectric layer 450 may cover the through dielectric pattern 410. Thus, when an etching process is performed to form the common source trench CTH, the through dielectric pattern 410 may not be etched.

The common source trench CTH may define first, second, third, and fourth stack structures ST1, ST2, ST3, and ST4 that are spaced apart from each other in a first direction X on the second substrate 200 (see FIG. 22). Each of the first to fourth stack structures ST1 to ST4 may include a patterned buffer dielectric layer 210, dielectric patterns 230, and sacrificial patterns 229. On the pad region 20 of the second substrate 200, the through dielectric pattern 410 may penetrate a portion of the first stack structure ST1. The mold structure MS may have non-etched portions that correspond to first, second, third, and fourth cell connectors CE1, CE2, CE3, and CE4, a plurality of first supporters SPP1, and a plurality of second supporters SPP2, which connectors and supporters are disposed between the first to fourth stack structures ST1 to ST4 adjacent to each other, as discussed above with reference to FIGS. 3 and 7 and FIGS. 12 to 17. The first supporters SPP1 may be formed between the second and third stack structures ST2 and ST3, and the second supporters SPP2 may be formed between the third and fourth stack structures ST3 and ST4. The first and second supporters SPP1 and SPP2 may be disposed between the second and third stack structures ST2 and ST3 and between the third and fourth stack structures ST3 and ST4, respectively, and may each include the sacrificial patterns 229 and the dielectric patterns 230 that are alternately and repeatedly stacked on the buffer dielectric layer 210.

Figure 20:
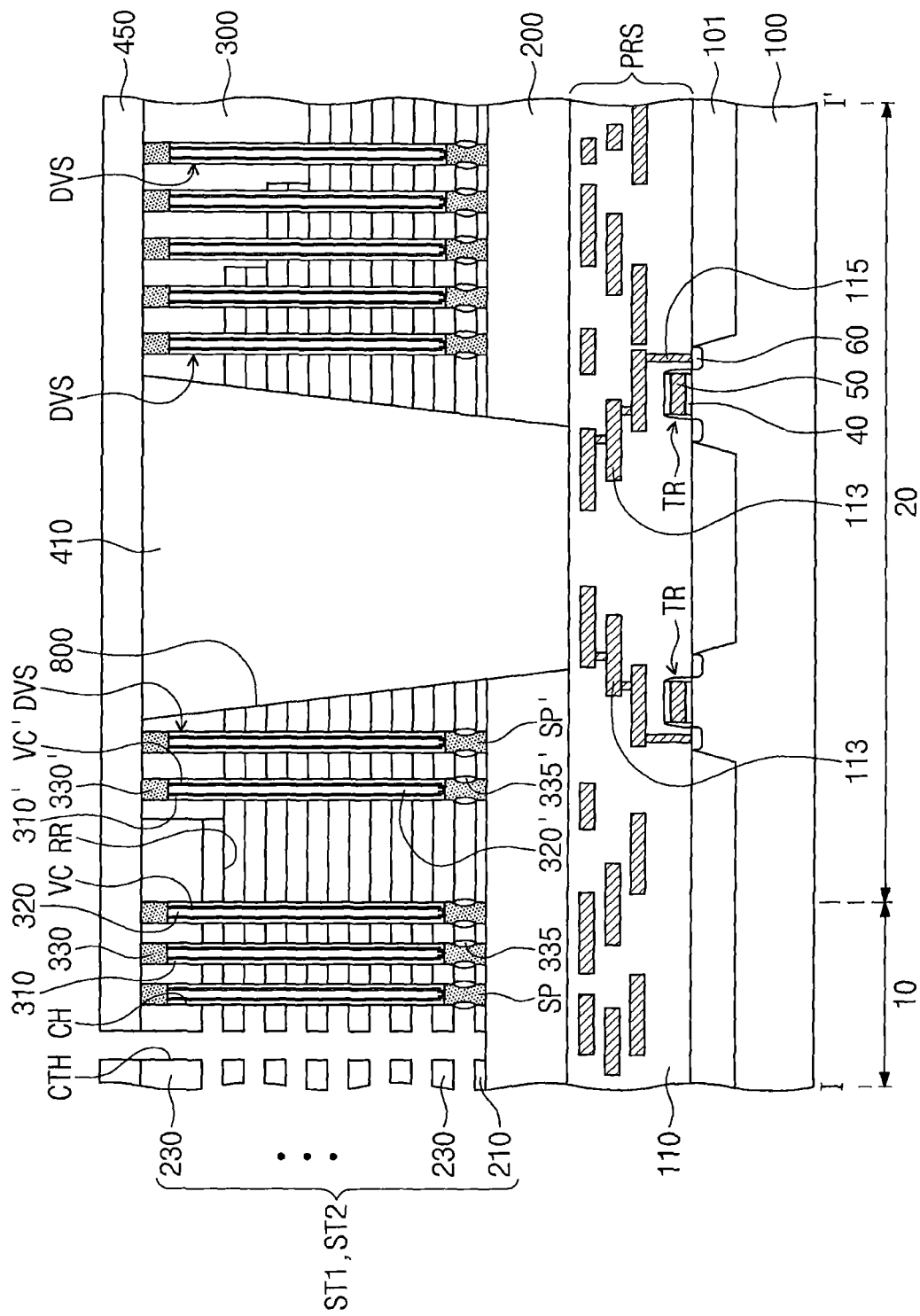
Figure 21:
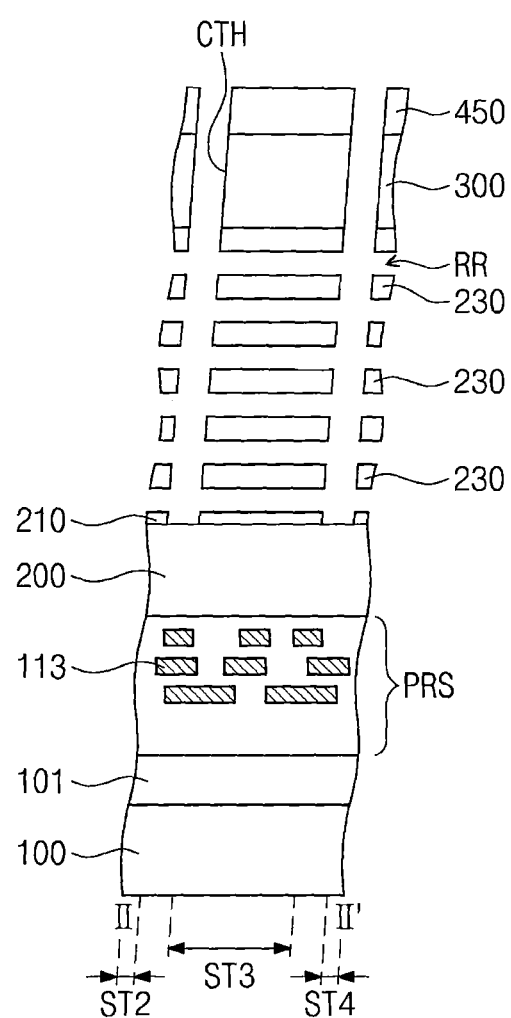
FIGS. 21 and 24 illustrate cross-sectional views taken along line II-II' of FIG. 3, showing a method of fabricating a three-dimensional semiconductor memory device according to some example embodiments of the present inventive concepts.
Figure 22:
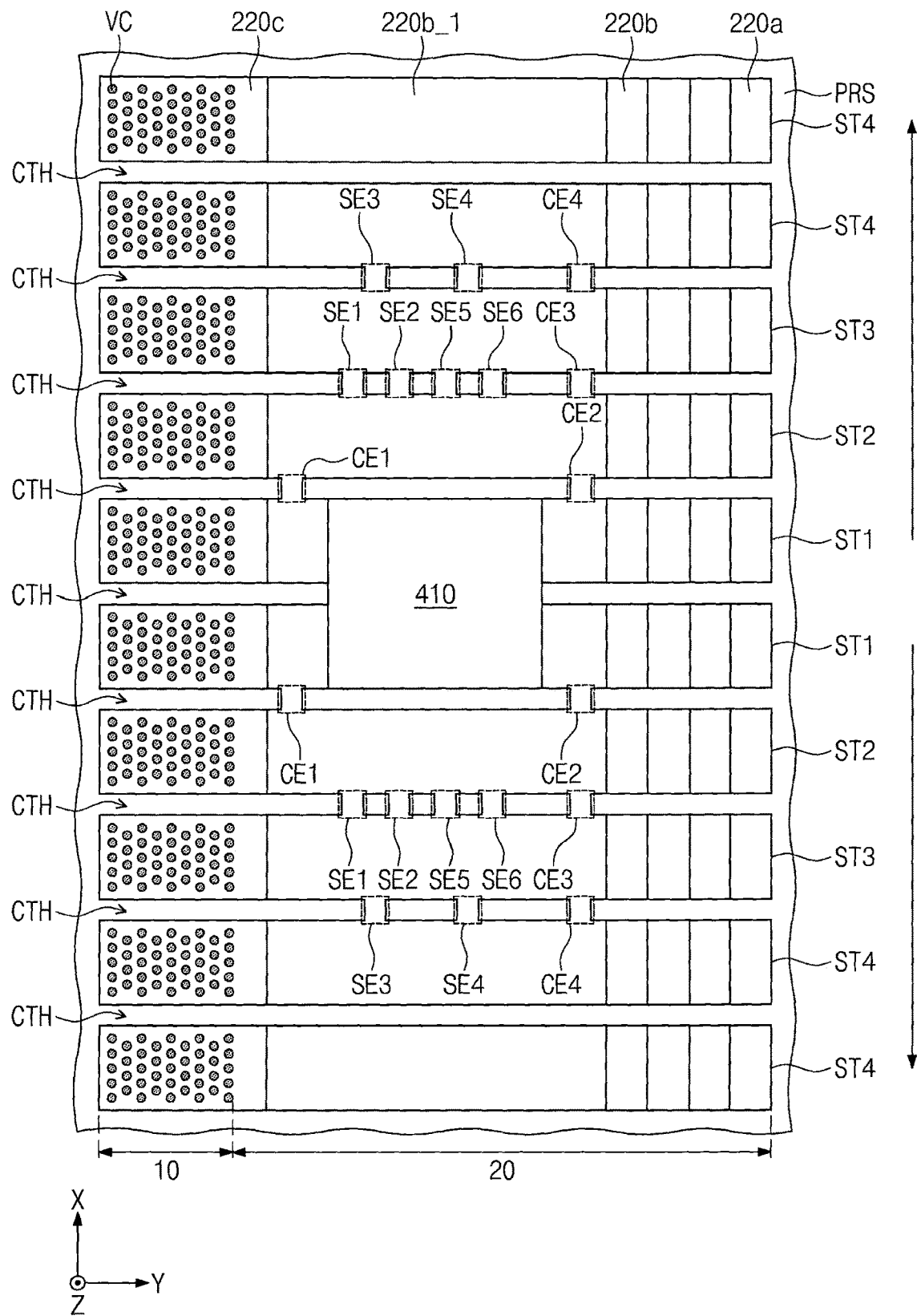
FIG. 22 illustrates a plan view showing a method of fabricating a three-dimensional semiconductor memory device according to some example embodiments of the present inventive concepts.

Referring to FIGS. 20 and 21, recess regions RR may be formed by removing the sacrificial patterns 229 exposed to the common source trench CTH. The sacrificial patterns 229 may be removed by performing a wet etching process and/or an isotropic dry etching process. The recess regions RR may be formed between the dielectric patterns 230 that are vertically adjacent to each other and between the buffer dielectric layer 210 and the lowermost dielectric pattern 230. The etching process may use an etchant including phosphoric acid. The recess regions RR may extend into gaps between vertically adjacent dielectric patterns 230 of the first and second supporters SPP1 and SPP2. For example, the sacrificial patterns 229 of the first and second supporters SPP1 and SPP2 may be removed simultaneously when the sacrificial patterns 229 of the first to fourth stack structures ST1 to ST4 are removed.

As illustrated in FIG. 21, in some embodiments, the stack structures ST1 to ST4 may be inclined. Referring also to FIG. 22, when the sacrificial patterns 229 are removed, as viewed in plan, the first to fourth stack structures ST1 to ST4 adjacent to the through dielectric pattern 410 and having a high aspect ratio may incline in a direction (indicated by an upwards or downwards arrow) away from the through dielectric pattern 410. For example, the first to fourth stack structures ST1 to ST4 may incline toward another fourth stack structure ST4 disposed close to the fourth stack structure ST4 thereof.

Gate dielectric layers 335 and dummy gate dielectric layers 335' may be formed on sidewalls of the semiconductor pillars SP and of the dummy semiconductor pillars SP', which sidewalls are exposed to the recess regions RR. The gate dielectric layers 335 and the dummy gate dielectric layers 335' may be formed by performing an oxidation process on the sidewalls of the semiconductor pillars SP and of the dummy semiconductor pillars SP'. The gate dielectric layers 335 and the dummy gate dielectric layers 335' may include, for example, a thermal oxide layer and/or a silicon oxide layer.

Figure 23:
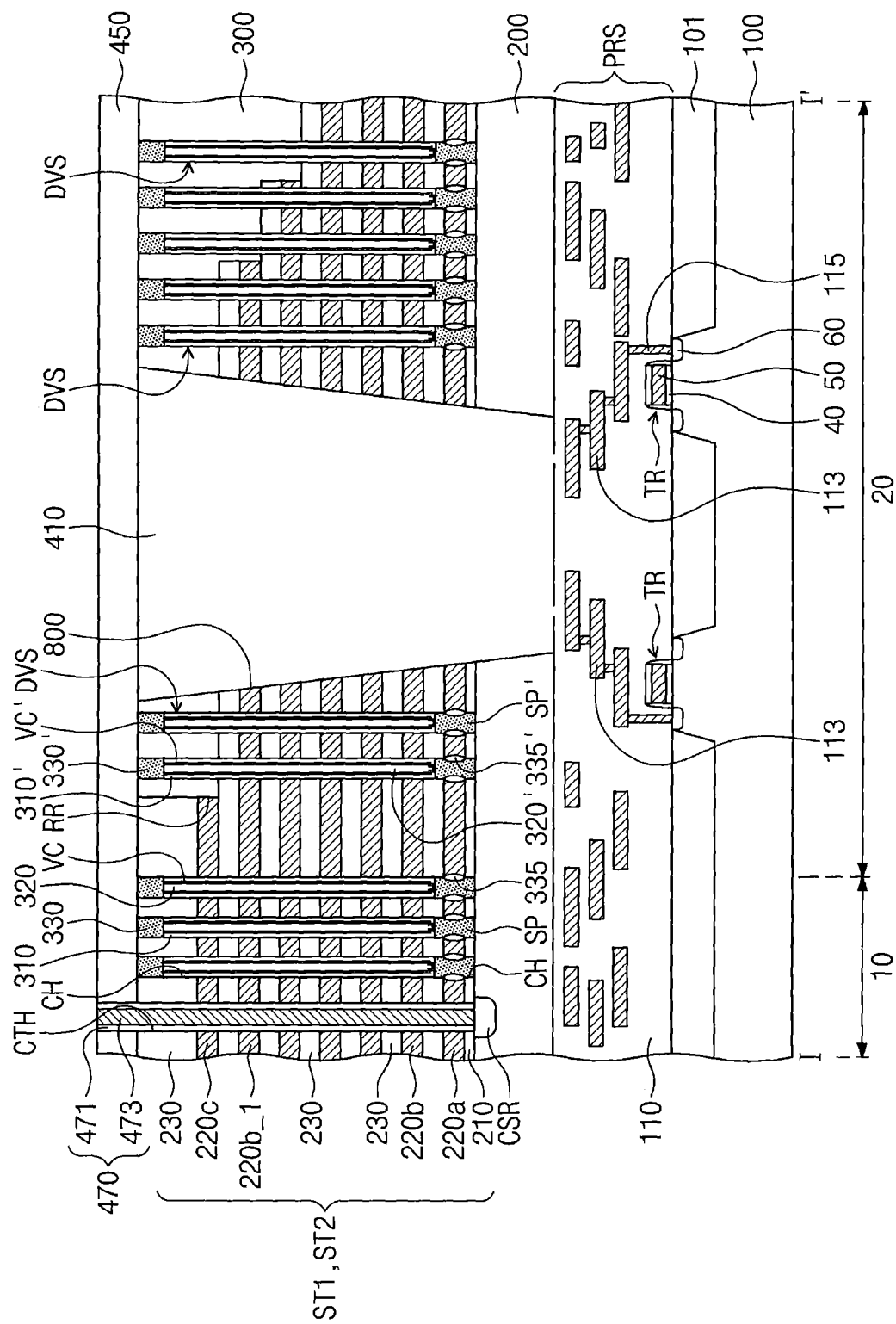
Figure 24:
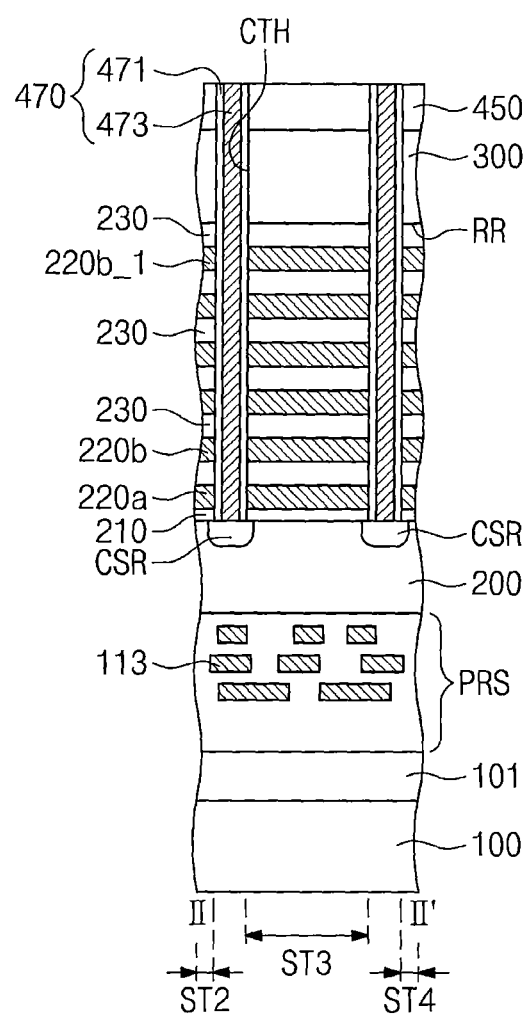

Referring to FIGS. 23 and 24, horizontal dielectric layers 340 (see FIG. 9) may be formed in the recess regions RR. For example, the horizontal dielectric layers 340 may conformally cover outer walls of the charge storage structures 310 and of the dummy charge storage structures 310', sidewalls of the gate dielectric layers 335 and of the dummy gate dielectric layers 335', portions of the interlayer dielectric pattern 300, portions of the through dielectric pattern 410, and top and bottom surfaces of the dielectric patterns 230, which covered parts are exposed to the recess regions RR. The horizontal dielectric layers 340 may be formed using a deposition process having good step coverage. For example, the horizontal dielectric layers 340 may be formed using chemical vapor deposition (CVD) or atomic layer deposition (ALD).

Gate electrodes 220a, 220b, 220b_1, and 220c may be formed in the recess regions RR. The formation of the gate electrodes 220a, 220b, 220b_1, and 220c may include forming a metal layer to fill the common source trench CTH and the recess regions RR, and then removing the metal layer formed in the common source trench CTH. A metallic material may fill the recess regions RR between vertically adjacent dielectric patterns 230 of the first and second supporters SPP1 and SPP2.

According to some example embodiments of the present inventive concepts, as shown in FIGS. 7 and 22, the first supporters SPP1 may be formed at a first location between the second and third stack structures ST2 and ST3, and the second supporters SPP2 may be formed at a second location between the third and fourth stack structures ST3 and ST4, which second location is farther away than the first location from the through dielectric pattern 410. The number of the first supporters SPP1 may be greater than the number of the second supporters SPP2, and a total planar area of the first supporters SPP1 may be greater than a total planar area of the second supporters SPP2. When a metallic material fills the recess regions RR of the first and second supporters SPP1 and SPP2, a total volume of metal layers filling the recess regions RR of the first supporters SPP1 may be greater than a total volume of metal layers filling the recess regions RR of the second supporters SPP2. When viewed in plan, the inclined first to fourth stack structures ST1 to ST4 may incline backwards toward the through dielectric pattern 410. For example, the inclined first to fourth stack structures ST1 to ST4 may restore their initial stacking state. It may therefore be possible to prevent and/or reduce contact failure between the first to fourth stack structures ST1 to ST4.

Though FIG. 22 illustrates a configuration of the first supporters SPP1 and the second supporters SPP2 that is similar to the configuration illustrated in FIG. 7, it will be understood that the present inventive concepts are not limited thereto. It will be understood that other configurations of the first supporters SPP1 and the second supporters SPP2 are possible without deviating from the present inventive concepts. For example, a method of fabricating a three-dimensional semiconductor memory device according to some example embodiments of the present inventive concepts may include configurations of the first supporters SPP1 and the second supporters SPP2 similar to those illustrated and described with respect to FIGS. 12 to 17.

Common source regions CSR may be formed in the second substrate 200 exposed to the common source trench CTH. An ion implantation process may be performed to form the common source regions CSR. The common source regions CSR may have a conductive type different from that of the second substrate 200.

A contact structure 470 may be formed in the common source trench CTH. The contact structure 470 may include a spacer 471 and a common source contact 473. The spacer 471 may cover sidewalls of the common source trench CTH. The common source contact 473 may be formed to fill a remaining space of the common source trench CTH in which the spacer 471 is formed.

Referring back to FIGS. 3 and 4, a third interlayer dielectric layer 500 may be formed on the second interlayer dielectric layer 450. The third interlayer dielectric layer 500 may be on, and in some embodiments, cover a top surface of the contact structure 470 and a top surface of the second interlayer dielectric layer 450. The third interlayer dielectric layer 500 may include, for example, a silicon oxide layer.

Channel contact plugs CCP may be formed on the pads 330, and cell contact plugs 510 may be formed on the ends of the gate electrodes 220a, 220b, 220b_1, and 220c, which ends are disposed on the pad region 20 of the second substrate 200. Peripheral contact plugs PCP may be formed in the through dielectric pattern 410, being connected to the transistors TR. The channel contact plugs CCP, the cell contact plugs 510, and the peripheral contact plugs PCP may include, for example, a metal layer and/or a metal silicide layer.

Bit lines BL and connection lines 520 may be formed on the third interlayer dielectric layer 500. The bit lines BL may extend in the first direction X and may have connection with the vertical channels VC, and the connection lines 520 may connect the cell contact plugs 510 to the peripheral contact plugs PCP.

According to some example embodiments of the present inventive concepts, when a removal process is performed to replace sacrificial layers with gate electrodes, support connectors may be formed between stack structures sequentially arranged on one side of a through dielectric pattern that penetrates the stack structure and a substrate, which support connectors are adjacent to the through dielectric pattern. As a result, it may be possible to prevent the stack structures from contact failure due to unidirectional inclination of the stack structures.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including,"

if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A three-dimensional semiconductor memory device, comprising:
    a peripheral circuit structure on a first substrate;
    a second substrate on the peripheral circuit structure;
    a first stack structure, a second stack structure, a third stack structure, and a fourth stack structure that are spaced apart in a first direction on the second substrate;
    a first support connector and a second support connector that are between the second stack structure and the third stack structure;
    a third support connector and a fourth support connector that are between the third stack structure and the fourth stack structure; and
    a through dielectric pattern that penetrates the first stack structure and the second substrate,
    wherein a first distance between the first support connector and the second support connector is less than a second distance between the third support connector and the fourth support connector, and
    wherein the first and second support connectors are closer to the through dielectric pattern than the third and fourth support connectors are to the through dielectric pattern.

2. The three-dimensional semiconductor memory device of claim 1, further comprising a fifth support connector between the second stack structure and the third stack structure,
    wherein the second support connector is between the first support connector and the fifth support connector, and
    wherein the second distance is equal to a third distance between the first support connector and the fifth support connector.

3. The three-dimensional semiconductor memory device of claim 1, further comprising a fifth support connector and a sixth support connector that are between the second stack structure and the third stack structure,
    wherein a line extending in the first direction from the third support connector extends between the first support connector and the second support connector, and
    wherein a line extending in the first direction from the fourth support connector extends between the fifth support connector and the sixth support connector.

4. The three-dimensional semiconductor memory device of claim 1, wherein a portion of the first support connector and a portion of the third support connector overlap one another in the first direction.

5. The three-dimensional semiconductor memory device of claim 1, wherein the first to fourth support connectors have a same planar area.

6. The three-dimensional semiconductor memory device of claim 1, wherein a respective planar area of each of the first and second support connectors is greater than a respective planar area of each of the third and fourth support connectors.

7. The three-dimensional semiconductor memory device of claim 1, wherein each of the first to fourth stack structures comprises a ground select gate electrode, a cell gate electrode, and a string select gate electrode that are stacked on the second substrate,
    wherein the first and second support connectors connect a first cell gate electrode of the second stack structure to a second cell gate electrode of the third stack structure, and
    wherein the third and fourth support connectors connect the second cell gate electrode of the third stack structure to a third cell gate electrode of the fourth stack structure.

8. The three-dimensional semiconductor memory device of claim 1, further comprising a first cell connector and a second cell connector that are between the first stack structure and the second stack structure, wherein each of the first and second stack structures comprise a first gate electrode, a second gate electrode, a third gate electrode that are sequentially stacked on the second substrate, the third gate electrode exposing a top surface of an end of the second gate electrode, wherein the through dielectric pattern penetrates the second gate electrode, wherein the first cell connector connects the second gate electrode of the first stack structure to the second gate electrode of the second stack structure, wherein the second cell connector connects the second gate electrode of the first stack structure to the second gate electrode of the second stack structure, and wherein a line extending in the first direction from the through dielectric pattern extends between the first cell connector and the second cell connector.

9. A three-dimensional semiconductor memory device, comprising:
a peripheral circuit structure on a first substrate;
a second substrate on the peripheral circuit structure;
a first stack structure, a second stack structure, a third stack structure, and a fourth stack structure that are spaced apart in a first direction on the second substrate;
a plurality of first supporters between the second stack structure and the third stack structure, the plurality of first supporters comprising a first support connector and a second support connector;
a plurality of second supporters between the third stack structure and the fourth stack structure, the plurality of second supporters comprising a third support connector and a fourth support connector; and
a through dielectric pattern that penetrates the first stack structure and the second substrate,
wherein a first number of the plurality of first supporters is greater than a second number of the plurality of second supporters,
wherein a first distance between the first support connector and the second support connector is less than a second distance between the third support connector and the fourth support connector, and
wherein the first and second support connectors are closer to the through dielectric pattern than the third and fourth support connectors are to the through dielectric pattern.

10. The three-dimensional semiconductor memory device of claim 9,
wherein a portion of the first support connector and a portion of the third support connector overlap one another in the first direction.

11. The three-dimensional semiconductor memory device of claim 9,
wherein a line extending in the first direction from the second support connector extends between the third support connector and the fourth support connector.

12. A three-dimensional semiconductor memory device, comprising:
a peripheral circuit structure on a first substrate;
a second substrate on the peripheral circuit structure;
a first stack structure, a second stack structure, a third stack structure, and a fourth stack structure that are spaced apart in a first direction on the second substrate;
a plurality of first supporters between the second stack structure and the third stack structure, the plurality of first supporters comprising a first support connector and a second support connector;
a plurality of second supporters between the third stack structure and the fourth stack structure, the plurality of second supporters comprising a third support connector and a fourth support connector; and
a through dielectric pattern that penetrates the first stack structure and the second substrate,
wherein a sum of first planar areas of the plurality of first supporters is greater than a sum of second planar areas of the plurality of second supporters,
wherein a first distance between the first support connector and the second support connector is less than a second distance between the third support connector and the fourth support connector, and
wherein the first and second support connectors are closer to the through dielectric pattern than the third and fourth support connectors are to the through dielectric pattern.

13. The three-dimensional semiconductor memory device of claim 12, wherein a first number of the plurality of first supporters is greater than a second number of the plurality of second supporters.

14. The three-dimensional semiconductor memory device of claim 12, wherein a first number of the plurality of first supporters is equal to a second number of the plurality of second supporters.

15. The three-dimensional semiconductor memory device of claim 12, wherein the first planar areas are equal to each other, and
wherein the second planar areas are equal to each other.

16. The three-dimensional semiconductor memory device of claim 15, wherein the first planar areas are larger or smaller than the second planar areas.

* * * * *